US005866293A

United States Patent [19]

Nomura et al.

[11] Patent Number: 5,866,293

[45] Date of Patent: Feb. 2, 1999

[54] HEAT-SENSITIVE RECORDING MATERIAL

[75] Inventors: Kimiatsu Nomura; Hiroshi Sato; Naoto Yanagihara; Tetsunori Matsushita; Shojiro Sano, all of Shizuoka, Japan

[73] Assignee: Fuji Photo Film Co., Ltd., Kanagawa, Japan

[21] Appl. No.: 859,716

[22] Filed: May 21, 1997

[30] Foreign Application Priority Data

May 21, 1996 [JP] Japan .................................... 8-126107
Dec. 28, 1996 [JP] Japan .................................... 8-358755

[51] Int. Cl.$^6$ ............................ G03C 1/58; G03F 7/016

[52] U.S. Cl. .......................... 430/138; 430/156; 430/157; 430/171; 430/182

[58] Field of Search .................................... 430/157, 171, 430/179, 182, 138, 156

[56] References Cited

U.S. PATENT DOCUMENTS

| | | | |
|---|---|---|---|
| 2,536,398 | 1/1951 | Slifkin | 95/6 |
| 2,537,098 | 6/1951 | Slifkin et al. | 430/182 |
| 3,910,794 | 10/1975 | Buisine et al. | 430/182 |
| 4,348,528 | 9/1982 | Breda et al. | 548/367 |
| 4,460,048 | 7/1984 | Kurihara et al. | 430/171 |
| 4,644,376 | 2/1987 | Usami et al. | 430/182 |
| 5,213,939 | 5/1993 | Sugiyama et al. | 430/138 |
| 5,407,777 | 4/1995 | Shimada et al. | 430/182 |

FOREIGN PATENT DOCUMENTS

| | | | |
|---|---|---|---|
| 159223 | 2/1983 | Germany . | |
| 2-54250 | 2/1990 | Japan | G03C 1/58 |
| 2-55251 | 2/1990 | Japan | G03C 1/58 |
| 4-135787 | 5/1992 | Japan | B41M 5/30 |
| 4-144784 | 5/1992 | Japan | B41M 5/30 |
| 629482 | 3/1946 | United Kingdom . | |

*Primary Examiner*—John S. Chu
*Attorney, Agent, or Firm*—Sughrue, Mion, Zinn, Macpeak & Seas, PLLC

[57] ABSTRACT

A heat-sensitive recording material having excellent light-fastness and raw stock storability is disclosed. The material includes a support and a heat-sensitive recording layer provided on the support, and the heat-sensitive recording layer contains a diazo compound and a coupler. The coupler contains at least one species of pyrazolone compounds represented by the following formula (1):

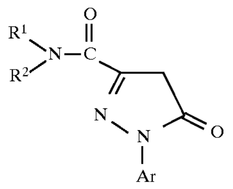

(1)

wherein Ar represents a phenyl group, a naphthyl group, or an aromatic heterocyclic group, any one of which may have a substituent bonded to the nucleus, said substituent may be a halogen atom, a cyano group, a trifluoromethyl group, an alkyl group, an aryl group, an alkoxycarbonyl group, a carbamoyl group, or a sulfamoyl group; $R^1$ and $R^2$ independently represent an alkyl group, an alkenyl group, or an aryl group, or $R^1$ and $R^2$ may be linked to each other so as to form a heterocycle.

21 Claims, No Drawings

HEAT-SENSITIVE RECORDING MATERIAL

BACKGROUND OF THE INVENTION

1. Field of the Invention

The present invention relates to a heat-sensitive recording material using a diazo compound and a coupler in combination as color-developing compounds, and particularly to a diazo heat-sensitive recording material which, after recording, exhibits excellent light-fastness with image and non-image areas.

2. Description of the Related Art

A diazo compound (diazonium salt compound) reacts with a compound called a coupler, such as phenol derivatives or compounds having an active methylene group, to form an azo dye. When irradiated with light, diazo compounds decompose and lose activity. Because of this property, diazo compounds have long been used as photosensitive recording materials; especially diazo copy (The Society of Photographic Science and Technology of Japan, "Basics of Photographic Engineering—Non-silver Salt Photography-" Corona Publishing Co., Ltd. (1982), pp. 89–117, 182–201).

Recently, diazo compounds have also been applied to recording materials which require fixation of an image. As a typical example of such application, there can be mentioned a light-fixation type heat-sensitive recording material in which a diazo compound and a coupler are heated and reacted in accordance with an image signal so as to form an image. Subsequently the thus-formed image is irradiated with light in order to be fixed (Koji SATO, et al. "The Journal of the Institute of Image Electronics Engineering of Japan" Vol. 11, No. 4 (1982), pp. 290–296).

However, these recording materials have the drawback of a relatively short shelf life since even when stored in a dark place, active diazo compounds gradually decompose thermally and thus lose reactivity. In order to solve this problem, there is proposed a method in which a diazo compound is contained in a microcapsule so as to isolate the diazo compound from water, bases, and similar compounds which would otherwise decompose the diazo compound. This method enables a recording material to dramatically increase its shelf life (Tomomasa USAML et al. "Journal of The Electrophotography Society" Vol. 26, No. 2 (1987), pp. 115–125).

A microcapsule having a glass-transition temperature higher than room temperature does not allow substances to enter through the wall at room temperature. It only allows substances to enter the wall at the glass-transition temperature or above, and thus can be applied as a heat-responsive microcapsule to a heat-sensitive recording material. Accordingly, a recording material comprising a support having a heat-sensitive recording layer coated thereon in which the heat-sensitive recording layer contains a diazo compound encapsulated in a heat-responsive microcapsule, a coupler, and a base enables: (1) the diazo compound to be stably stored over a long period of time; (2) an image to be color-developed through application of heat; and (3) an image to be fixed through irradiation with light.

Recently, there have been developed heat-sensitive recording materials of this kind having advanced functions for forming multicolor images (Japanese Patent Application Laid-Open (JP-A) Nos. 4-135787 and 4-144784). Improved performance is desired in such heat-sensitive recording materials having advanced functions. As is fundamentally improved raw stock storability before use for recording, and improved light-fastness with image and non-image areas after use for recording.

For example, there are proposed methods of using a cyclic 1,3-diketone compound as a coupler in order to obtain a red image (Japanese Patent Application Laid-Open (JP-A) Nos. 2-54250 and 2-54251).

However, these methods fail to sufficiently provide the above-described performance or improvements.

SUMMARY OF THE INVENTION

To solve the above-mentioned problems, the inventors of the present invention carried out extensive studies, and found that use of a pyrazolone compound as a coupler provides very good results, thus achieving the present invention.

Accordingly, the object of the present invention is to provide a heat-sensitive recording material capable of providing red images having high quality, excellent raw stock storability before use with good maintenance of texture whiteness, and excellent light-fastness of image and non-image areas.

The object of the present invention has been achieved by a heat-sensitive recording material comprising a support and a heat-sensitive recording layer provided on the support, the heat-sensitive recording layer containing a diazo compound and a coupler, wherein the coupler contains at least one pyrazolone compound represented by the following formula (1):

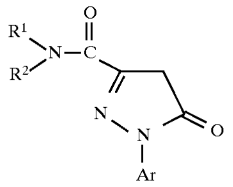

(1)

wherein Ar represents a phenyl group, a naphthyl group, or an aromatic heterocyclic group, all of which may have substituents including a halogen atom, a cyano group, a trifluoromethyl group, an alkyl group, an aryl group, an alkoxycarbonyl group, a carbamoyl group, or a sulfamoyl group; $R^1$ and $R^2$ independently represent an alkyl group, an alkenyl group, or an aryl group, or $R^1$ and $R^2$ may be linked to each other so as to form a heterocycle.

DETAIL DESCRIPTION OF THE PREFFERED EMBODIMENT

In the above-described formula (1), each of $R^1$ and $R^2$, which may be identical to or different from each other, preferably represents a substituted or unsubstituted alkyl group having 1 to 20 carbon atoms (hereinafter may be referred to as C1–C20), and more specifically, represents a C1–C20 unsubstituted alkyl group which may be branched. Other examples of $R^1$ and $R^2$ include a halogen-substituted C1–C 10 alkyl group, a C2–C20 alkyl group substituted by a C1–C10 alkoxy group, a C7–C20 alkyl group substituted by a C6–C10 aryloxy group, a C3–C 19 alkyl group substituted by a C2–C18 alkoxycarbonyl group, a C7–C11 alkyl group substituted by a C6–C10 aryl group, a C2–C20 alkenyl group, and a C6–C10 aryl group.

In the above formula, Ar is preferably a phenyl group, a naphthyl group, a pyridyl group, a pyrimidinyl group, an imidazolyl group, or a triazolyl group, with a phenyl group being particularly preferred.

Examples of the substituents which may be introduced into the naphthyl, phenyl, or aromatic heterocyclic group represented by Ar include C1–C10 alkyl groups, C1–C20 alkoxy groups, Br, Cl, F, CN, C1–C20 acyl groups, C2–C18 alkoxycarbonyl groups, alkoxycarbonyl groups each having a C1–C20 alkoxy group, substituted or unsubstituted C1–C21 carbamoyl group, and substituted or unsubstituted C0–C20 sulfamoyl group. Of these, halogen atoms and C1–C10 alkyl groups are particularly preferred.

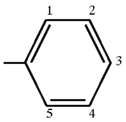

When Ar is a phenyl group as described above, at least one substituent therefor is preferably present at the 1-position. More preferably, Ar has a chlorine atom at each of the 1-and 5-positions, and in addition, a chlorine atom, a methyl group, a cyano group, or an alkoxy group at the 3-position.

Examples of preferred substituents are shown below.

 (1)

1 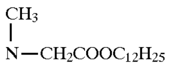

2 $N(C_4H_9)_2$

3 $N(C_8H_{17})_2$

4 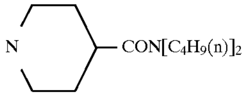

5 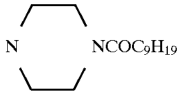

6 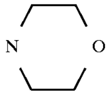

7 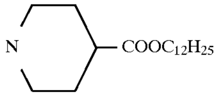

8 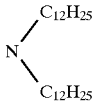

9 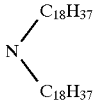

10 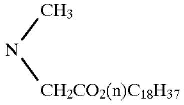

-continued

Ar: (2)

1 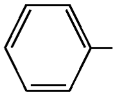

2 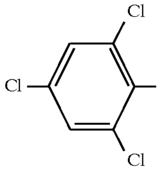

3 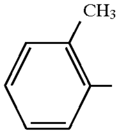

4 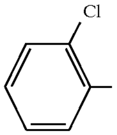

5 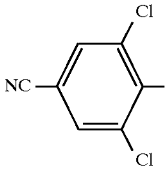

6 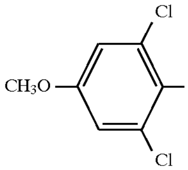

7 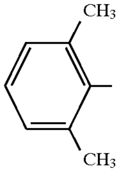

8 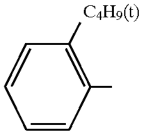

Specific examples of the pyrazolone compounds which may be used in the present invention include, but are not limited to, the following compounds.

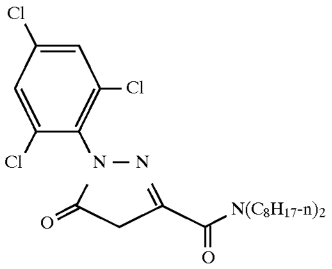
B-1
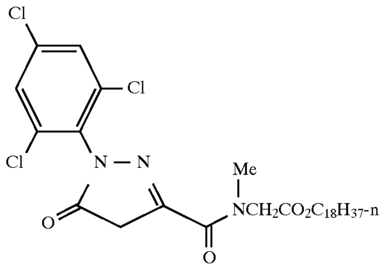
B-2
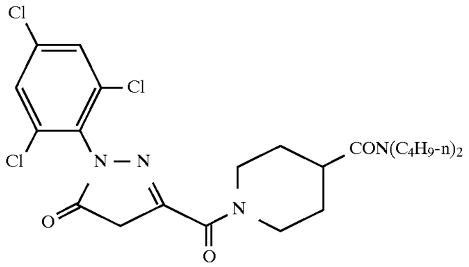
B-3
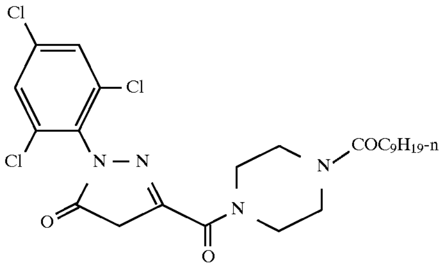
B-4
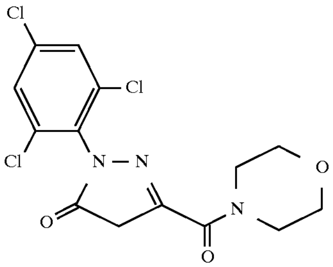
B-5
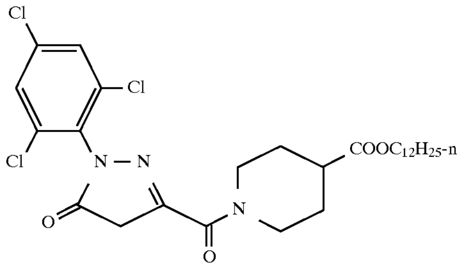
B-6
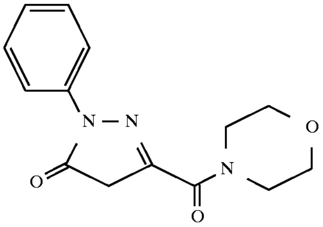
B-7
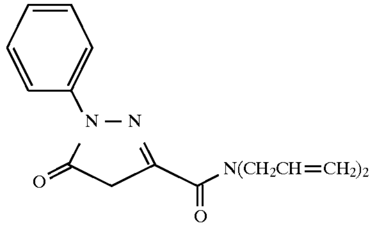
B-8
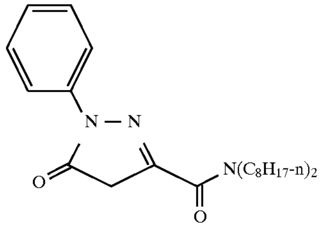
B-9
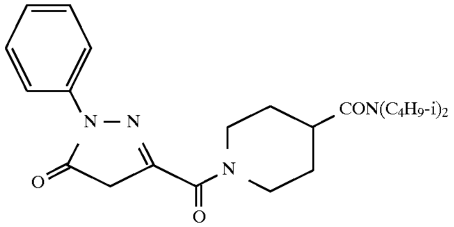
B-10
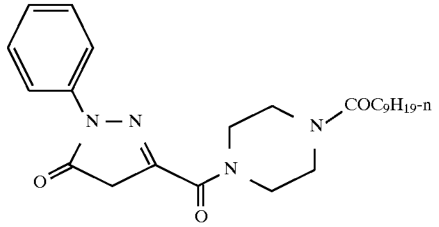
B-11
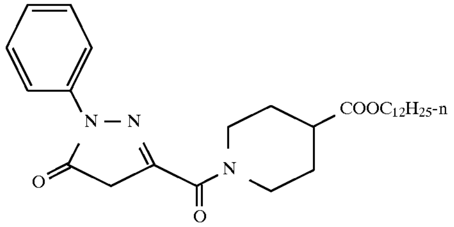
B-12

-continued
B-13
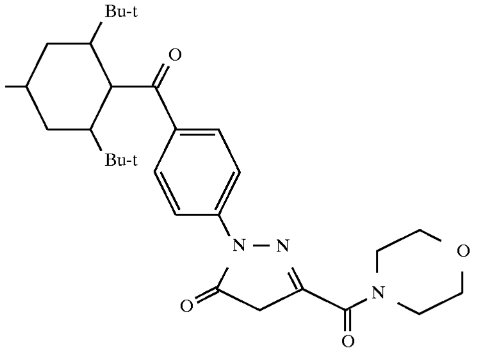
B-14
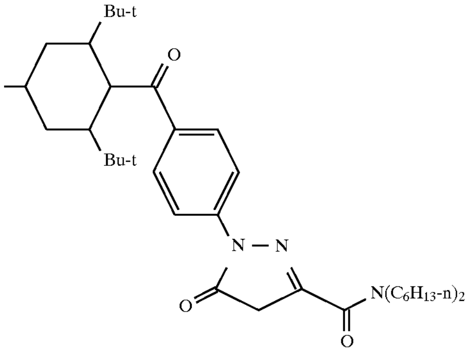
B-15
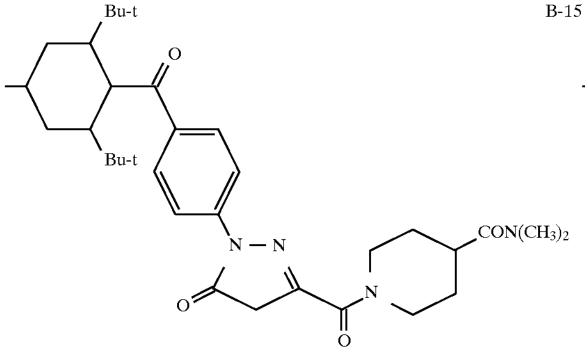
B-16
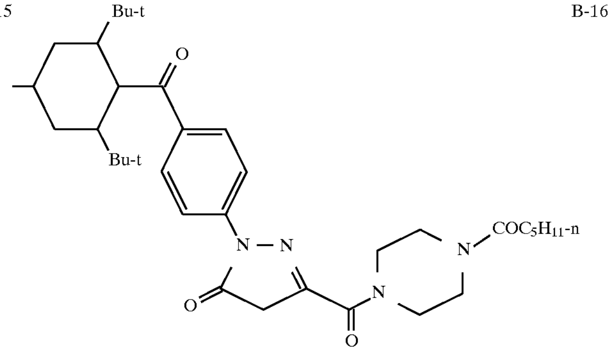
B-17
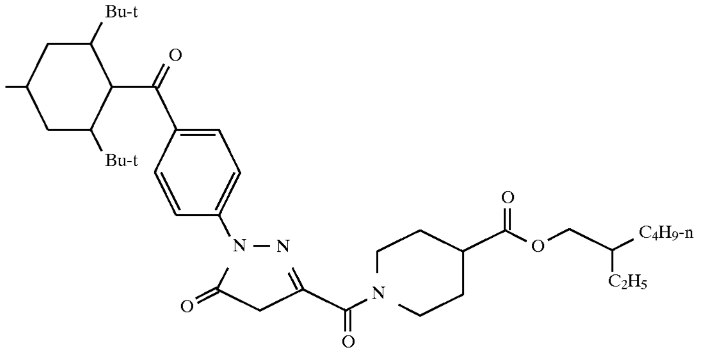
B-18
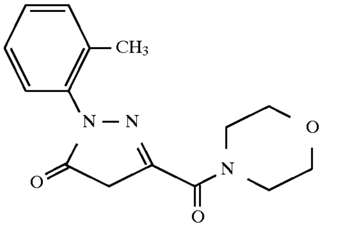
B-19
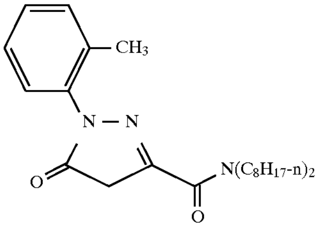
B-20
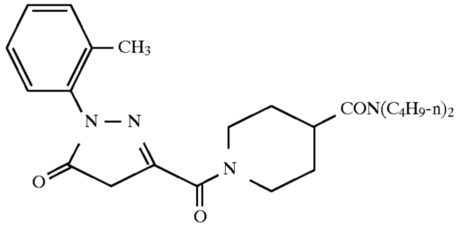
B-21
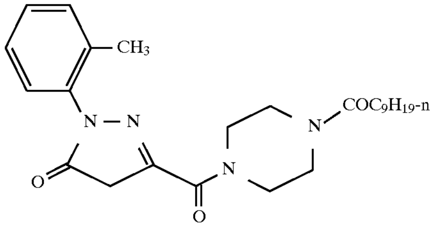

-continued
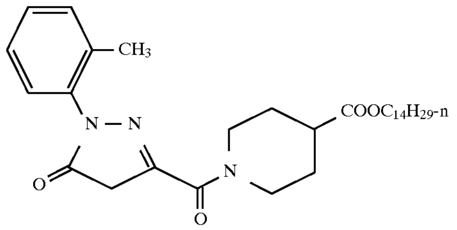
B-22
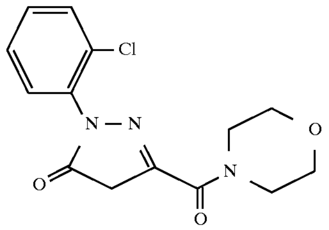
B-23
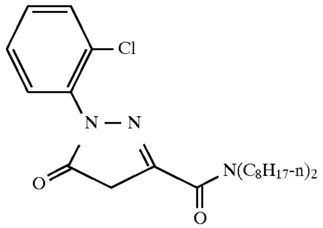
B-24
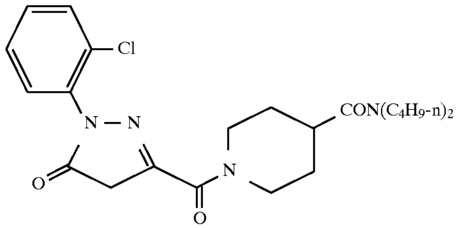
B-25
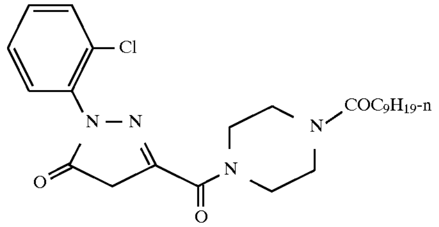
B-26
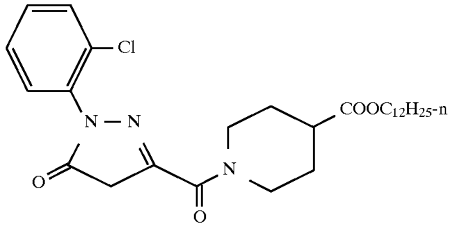
B-27
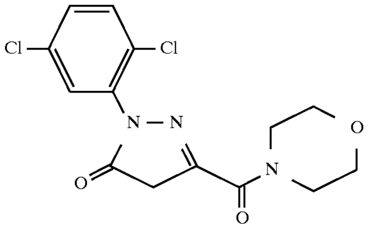
B-28
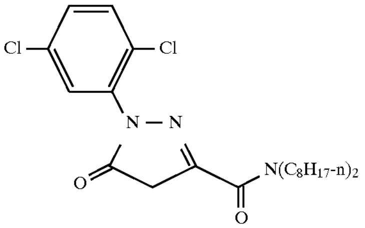
B-29
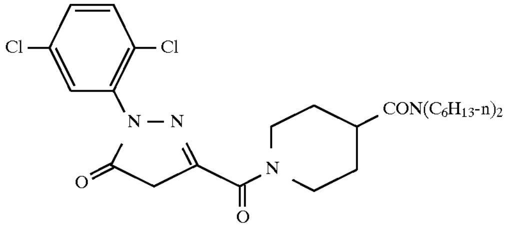
B-30
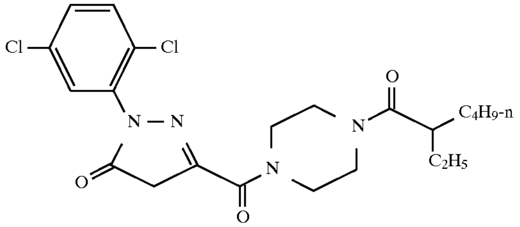
B-31
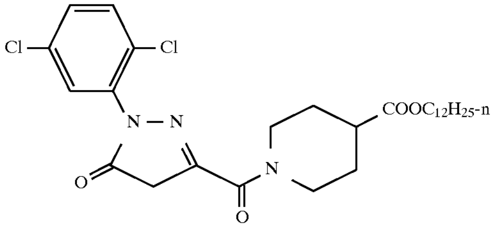
B-32
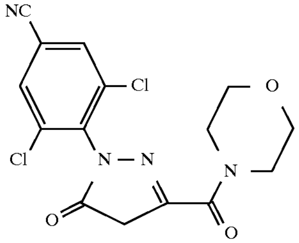
B-33
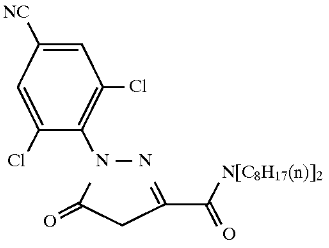
B-34
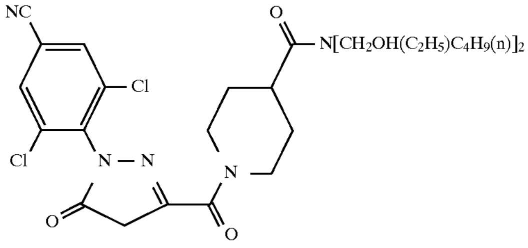
B-35

-continued
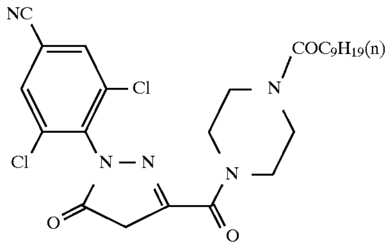
B-36
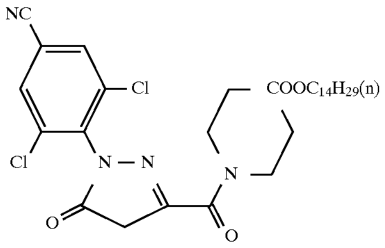
B-37
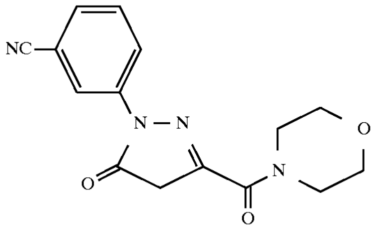
B-38
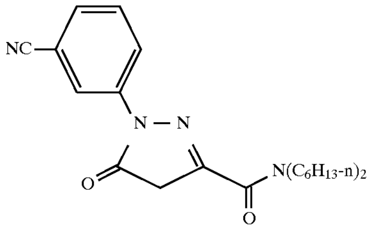
B-39
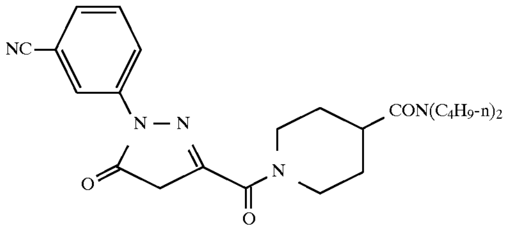
B-40
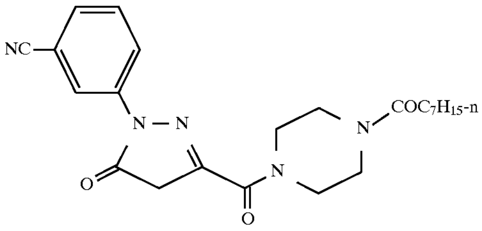
B-41
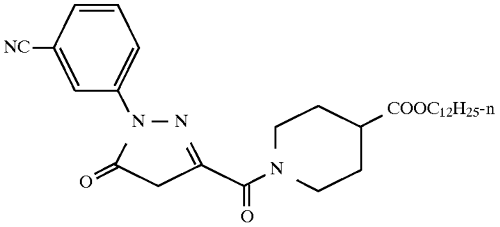
B-42
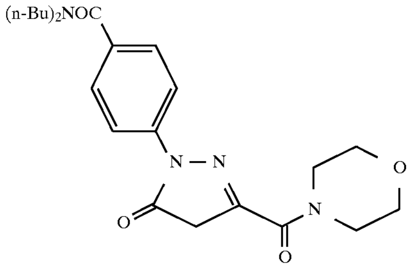
B-43
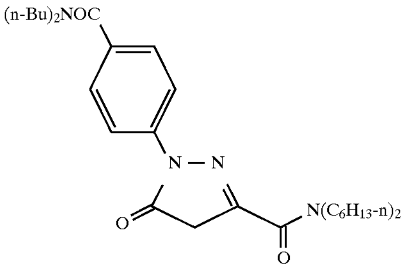
B-44
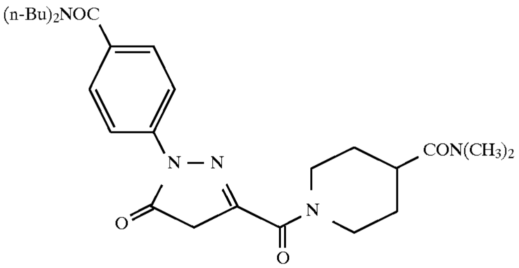
B-45
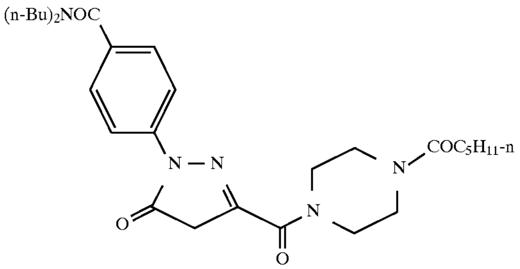
B-46
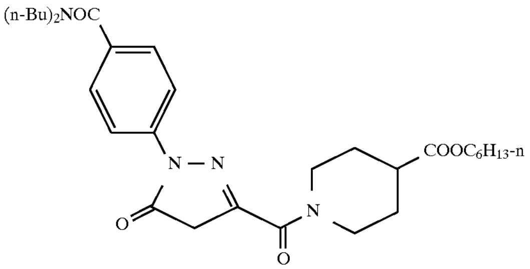
B-47

-continued

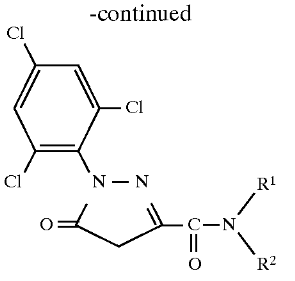

| | | |
|---|---|---|
| B-48 | $R^1 = (n)C_{12}H_{25}$ | $R^2 = (n)C_{12}H_{25}$ |
| B-49 | $R^1 = (n)C_{18}H_{37}$ | $R^2 = (n)C_{18}H_{37}$ |

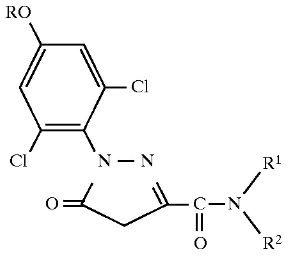

| | —R | —$R^1$ | —$R^2$ |
|---|---|---|---|
| B-50 | $-CH_3$ | $-(n)C_8H_{17}$ | $-(n)C_8H_{17}$ |
| B-51 | $-CH_3$ | $-(n)C_{12}H_{25}$ | $-(n)C_{12}H_{25}$ |
| B-52 | $-CH_3$ | $-(n)C_{18}H_{37}$ | $-(n)C_{18}H_{37}$ |
| B-53 | $-(n)C_8H_{17}$ | $-(n)C_8H_{17}$ | $-(n)C_8H_{17}$ |
| B-54 | $-(n)C_{12}H_{25}$ | $-(n)C_8H_{17}$ | $-(n)C_8H_{17}$ |

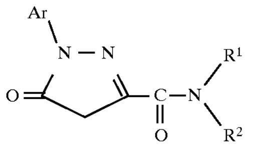

| | —Ar | —$R^1$ | —$R^2$ |
|---|---|---|---|
| B-55 | 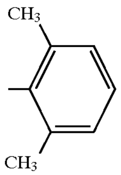 | $-(n)C_8H_{17}$ | $-(n)C_8H_{17}$ |
| B-56 | 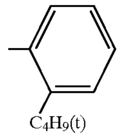 | $-(n)C_8H_{17}$ | $-(n)C_8H_{17}$ |

These couplers may have either the keto- or the enol form. Alternatively, they may be present as mixtures of these two forms.

In the heat-sensitive recording materials of the present invention, the diazo compounds that are used in combination with couplers develop color through coupling with the couplers, and are light-degradable. The diazo compounds have different maximum absorption wavelengths in accordance with the position and identity of the substituent present in the aromatic ring moiety.

Examples of preferred diazoniums that form salts include:

(A) those in which the p-position of the diazonium group has been substituted by an arylthio group or an alkylthio group, and (B) those in which the p-position of the diazonium group has been substituted by an amino group.

Specific examples of group (A) compounds include 4-(p-tolylthio)-2,5-dibutoxybenzenediazonium, 4-(4-chlorophenylthio)-2,5-dibutoxybenzenediazonium, and 4-(2-ethylhexylthio)-2,5-dibutoxybenzenediazonium.

Specific examples of group (B) compounds include those represented by the following formula (2):

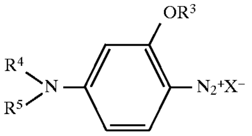

(2)

wherein each of $R^3$, $R^4$, and $R^5$ represents an alkyl group, an aralkyl group, or an aryl group, and $R^4$ and $R^5$ may form a ring together with a nitrogen atom; and $X^-$ represents an acid anion.

In formula (2), each of $R^3$, $R^4$, and $R^5$ is preferably a C1–C18 alkyl group, a C7–C21 aralkyl group, or a C6–C20 aryl group, any of which may have a substituent.

When $R^3$, $R^4$, or $R^5$ in formula (2) have a substituent, examples of the substituent include an alkyl group, an aryl group, an alkyloxy group, an aryloxy group, an alkylthio group, an arylthio group, an acyl group, an alkoxycarbonyl group, an acyloxy group, a carbamoyl group, an alkylsulfonyl group, an arylsulfonyl group, a sulfamoyl group, an acylamino group, a halogen atom, and a cyano group.

In formula (2), the sum of the carbon numbers of $R^3$, $R^4$, and $R^5$ is preferably greater than or equal to 12, and more preferably greater than or equal to 14 because of good oil-solubility.

Examples of acid anions represented by X in formula (2) include C1–C9 polyfluoroalkylcarboxylic acids, C1–C9 polyfluoroalkylsulfonic acids, boron tetrafluoride, tetraphenyl boron, hexafluorophosphoric acid, aromatic carboxylic acids, and aromatic sulfonic acids. Zinc chloride, cadmium chloride, tin chloride, etc. can be used as an acid anion represented by X to form, together with the diazonium salts, a complex, thereby stabilizing the diazonium salts.

Of the compounds represented by formula (2), compounds of formula (3) are particularly preferred due to good storage properties before recording:

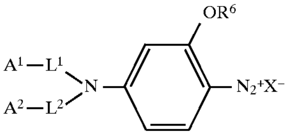

(3)

wherein $R^6$ represents an alkyl group, an aralkyl group, or an aryl group; each of $L^1$ and $L^2$, which may be identical to or different from each other, represents an alkylene group; each of $A^1$ and $A^2$, which may be identical to or different from each other, represents an alkyl group, an aralkyl group, an aryl group, an alkyloxy group, an aryloxy group, an alkylthio group, an arylthio group, an acyl group, an alkoxycarbonyl group, an acyloxy group, a carbamoyl group, an alkylsulfonyl group, an arylsulfonyl group, a sulfamoyl group, a halogen atom, or a cyano group; and $X^-$ represents an acid anion.

Preferred examples of compounds of formula (3) include those in which at least one of $A^1$ and $A^2$ is an alkoxycarbonyl group, a carbamoyl group, a sulfamoyl group, or a cyano group.

The melting point of the diazo compounds used in the present invention is preferably between 30° and 200° C. In consideration of ease of handling, diazo compounds having a melting point of 50°–150° C. are particularly preferred.

In the present invention, when the diazo compounds are encapsulated in microcapsules described hereinbelow, the diazo compounds preferably have low solubility in water and suitable solubility to solvents that are used in the manufacture of the microcapsules. Specifically, the diazo compounds preferably have 5% or higher solubility in organic solvents that are used and 1% or less solubility in water.

In the present invention, the heat-sensitive recording layer preferably contains the diazo compounds in amounts ranging from 0.02 to 3 $g/m^2$. In order to obtain sufficient color density, the diazo compounds are preferably contained in amounts ranging from 0.1 to 2 $g/m^2$.

Specific examples of the diazo compounds which are represented by the aforementioned formula (2) and which are advantageously employed in the heat-sensitive recording material of the present invention are shown below. However, the diazo compounds useful in the present invention are not limited only to the below-listed compounds.

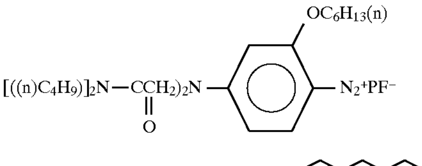

(A-1)

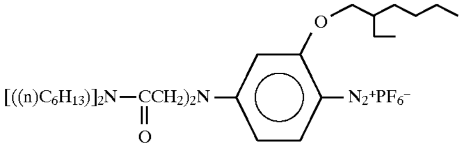

(A-2)

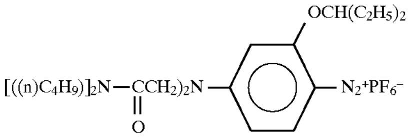

(A-3)

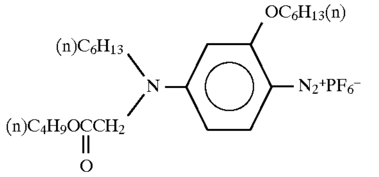

(A-4)

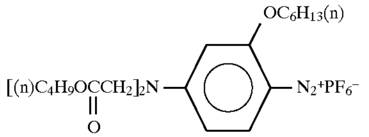

(A-5)

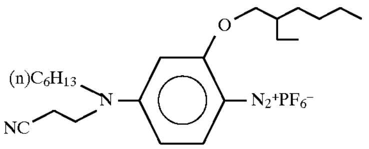

(A-6)

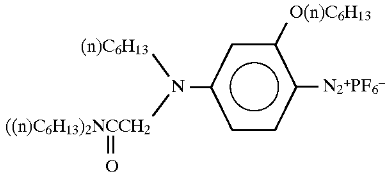

(A-7)

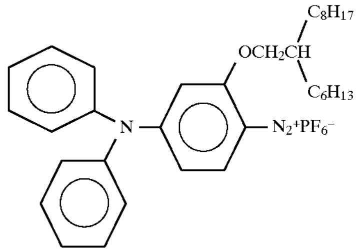

(A-8)

-continued (A-9)

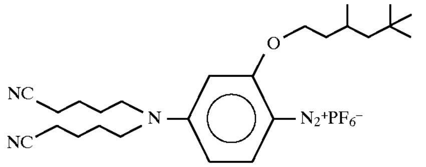

(A-10)

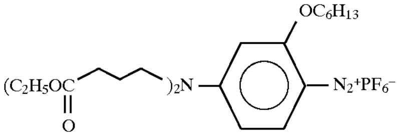

(A-11)

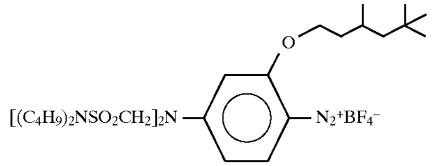

(A-12)

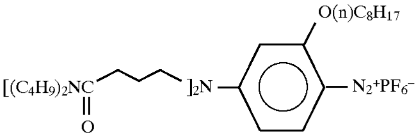

(A-13)

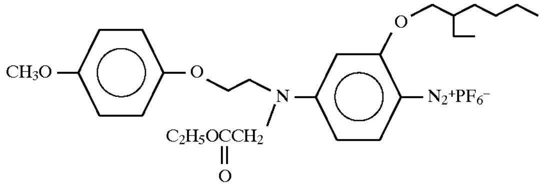

(A-14)

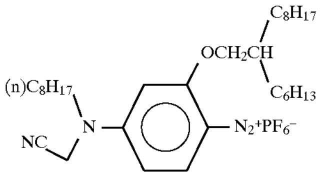

(A-15)

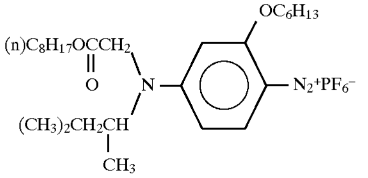

(A-16)

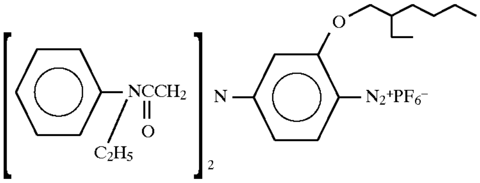

(A-17)

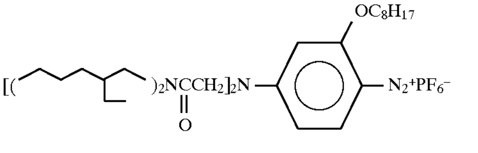

-continued (A-18)

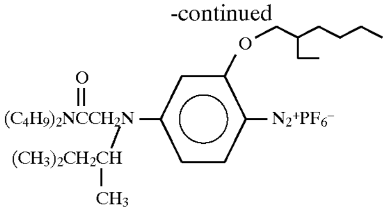

A-19

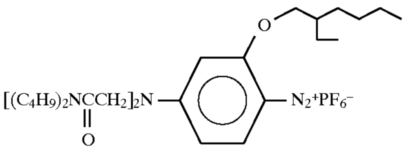

A-20

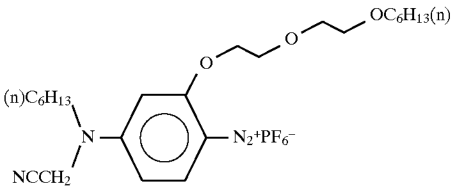

A-21

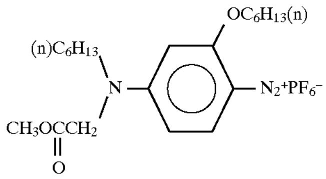

A-22

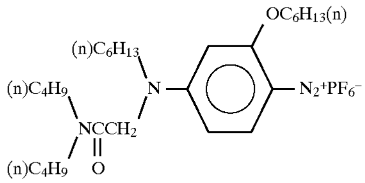

The diazo compounds of formula (2) may be used singly or in combination of two or more species. Moreover, in accordance with purposes such as color adjustment, the diazo compounds of formula (2) may be used in combination with known diazo compounds. In this case, the proportion of the diazo compounds of formula (2) with respect to the entirety of the diazo compounds incorporated in the recording layer is preferably 50% by weight or more. Examples of preferred diazo compounds which may be co-used together with the diazo compounds of formula (2) include 4-diazo-1-dimethylaminobenzene, 4-diazo-2-butoxy-5-chloro-1-dimethylaminobenzene, 4-diazo-1-methylbenzylaminobenzene, 4-diazo-1-ethylhydroxyethylaminobenzene, 4-diazo-1-diethylamino-3-methoxybenzene, 4-diazo-1-morpholinobenzene, 4-diazo-1-morpholino-2,5-dibutoxybenzene, 4-diazo-1-toluylmercapto-2,5-diethoxybenzene, 4-diazo-1-piperazino-2-methoxy-5-chlorobenzene, 4-diazo-1-(N,N-dioctylaminocarbonyl)benzene, 4-diazo-1-(4-tert-octylphenoxy)benzene, 4-diazo-1-(2-ethylhexanoylpiperidino)-2,5-dibutoxybenzene, and 4-diazo-1-[α-(2,4-di-tert-amylphenoxy)butyrylpiperidino]benzene.

In the present invention, known couplers that form dyes through coupling with a diazo compound in a basic atmosphere may be used in combination with the coupler components of formula (1) to thereby adjust color hue. In this case, the proportion of the couplers of formula (1) with respect to the entirety of the couplers incorporated in the recording layer is preferably 50% by weight or more.

Examples of known couplers that may be used in combination with couplers of formula (1) include, but are not limited to, the so-called active methylene compounds (each having a methylene group adjacent to the carbonyl group), phenol derivatives, and naphthol derivatives. Specific mention may be given to resorcin, phloroglucin, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfonaphthalene, 2-hydroxy-3-naphthoic acid morpholinopropylamide, 2-hydroxy-3-naphthoic acid octylamide, 2-hydroxy-3-naphthoic acid anilide, benzoylacetanilide, 1-phenyl-3-methyl-5-pyrazolone, 1-(2,4,6-trichlorophenyl)-3-anilino-5-pyrazolone, 2-{3-[α-(2,4-di-tert-amylphenoxy)butanamide]benzamide}phenol, 2,4-bis(benzoylacetamino)toluene, and 1,3-bis-(pivaloylacetaminomethyl)benzene.

In the heat-sensitive recording material of the present invention, a diazo compound is preferably encapsulated in a microcapsule in order to improve raw stock storability before use.

The microcapsules for this use are produced by the steps of dissolving, in a non-aqueous solvent having a boiling point of 40° to 95° C. at atmospheric pressure, a diazo compound, and a polymer forming compound or polymer forming compounds, emulsifying the resultant solution in a hydrophilic protective colloidal solution, heating the emulsion at reduced pressure in a reaction container to remove the solvent, to allow the polymer-forming compound(s) to move to oil-droplet surfaces, and to cause polymer formation (wall film formation) by polyaddition or polycondensation on the surfaces of the oil droplets.

In the present invention, in order to obtain good shelf life, it is particularly preferable to use microcapsules which substantially contain no solvent. The polymer for forming the walls of microcapsules is preferably at least one of polyurethane and polyurea.

Next will be described a method of producing diazo compound-containing microcapsules (with a polyurea úpolyurethane wall).

First, a diazo compound is dissolved in a hydrophobic organic solvent, which becomes the cores of capsules. In this case, the organic solvent is preferably at least one selected from the group consisting of hydrocarbon halides, carboxylic esters, phosphoric esters, ketones, and ethers. To this solvent is added polyfunctional isocyanate as a material for the microcapsule walls (oil phase).

An aqueous solution of a water-soluble polymer such as polyvinyl alcohol or gelatin is prepared as an aqueous phase. The above-described oil phase is added to this aqueous phase, and the resultant mixture is emulsified by means of a homogenizer or the like. In this case, the water-soluble polymer serves as a stabilizer for emulsification. For stabler emulsification, a surfactant may be added to at least one of the oil phase and the aqueous phase.

The amount of polyfunctional isocyanate is determined such that microcapsules have a mean diameter of 0.3 to 12 μm and a wall thickness of 0.01 to 0.3 μm. Each of the dispersed particles generally has a diameter of 0.2 to 10 μm. Polyfunctional isocyanate is polymerized at the interface between the oil phase and the aqueous phase in the emulsion to form polyurea walls.

The above-described hydrophobic organic solvent, which dissolves a diazo compound and forms the cores of microcapsules, preferably has a boiling point of 100° to 300° C. Examples of the hydrophobic organic solvent include aromatic hydrocarbons such as alkylnaphthalene, alkyldiphenyl ethane, alkyldiphenyl methane, and alkylbiphenyl; chlorinated paraffin; phosphoric esters such as trixylyl phosphate, and tricresyl phosphate; carboxylic acid esters such as maleic esters and adipic acid esters; sulfuric esters; and sulfonic esters. Two or more of them may be used in combination.

When a diazo compound encapsulated in microcapsules is less soluble in these organic solvents, a low boiling point solvent highly capable of dissolving this diazo compound may be used in combination with any of the above-mentioned organic solvents. Examples of such a low boiling point solvent include ethyl acetate, butyl acetate, methylene chloride, tetrahydrofuran, and acetone. When only the low boiling point solvent is used as a hydrophobic organic solvent for use in manufacture of microcapsules, this low boiling point solvent evaporates during the encapsulation reaction, thereby forming coreless microcapsules in which a diazo compound is incorporated into the microcapsule walls.

The polyfunctional isocyanate compound used as material for the microcapsule wall preferably has trifunctional or higher functional isocyanate groups but may be used in combination with a bifunctional isocyanate compound. Examples of such polyfunctional isocyanates include diisocyanate such as xylene diisocyanate and hydrogenated xylene diisocyanate, hexamethylene diisocyanate, tolylene diisocyanate and hydrogenated tolylene diisocyanate, or isophorone diisocyanate, a dimer or trimer (Biurate or Isocyanurate) thereof; polyfunctional isocyanate obtained by adding isocyanate to polyol such as trimethylolpropane; and a condensation product of formalin and benzene isocyanate.

Further, polyol or polyamine may be added to a hydrophobic solvent serving as a core or a solution of a water-soluble polymer serving as dispersion medium and may be used as one of materials for the microcapsule wall. When the aqueous phase contains a polyol, polyfunctional isocyanate and polyol react with each other to form a polyurethane wall. So as to accelerate the reaction, a reaction temperature is preferably maintained at a high temperature or an adequate polymerization catalyst is preferably added. Polyfunctional isocyanate, polyol, reaction catalyst, and polyamine used for forming part of the microcapsule wall are disclosed in detail in publications (edited by Keiji IWATA, "Polyurethane Handbook" The Nikkan Kogyo Shimbun Ltd. (1987)). Examples of polyol or polyamine include propylene glycol, glycerin, trimethylolpropane, triethanolamine, sorbitol, and hexamethylenediamine.

A water-soluble polymer which is used in an aqueous solution in which thus-prepared oil phase is dispersed preferably has a water solubility of greater than or equal to 5% (w/w) at an emulsification temperature. Specific examples of such a water-soluble polymer include polyvinyl alcohol and its modified substances, polyacrylamide and its derivatives, ethylene-vinyl acetate copolymer, styrene-maleic anhydride copolymer, ethylene-maleic anhydride copolymer, isobutylene-maleic anhydride copolymer, polyvinyl pyrrolidone, ethylene-acrylic acid copolymer, vinyl acetate-acrylic acid copolymer, carboxymethylcellulose, methylcellulose, casein, gelatin, starch derivatives, acacia, and sodium alginate.

Preferably, these water-soluble polymers do no react with isocyanate compounds or have a relatively low reactivity with isocyanate compounds. For example, like gelatin, a water-soluble polymer having a reactive amino group must have the reactive amino group nonreactive through modification or the like.

When a surfactant is added to the aqueous phase or the oil phase, the amount of the surfactant added preferably ranges from 0.1% to 5% by weight, particularly preferably from 0.5% to 2% by weight, based on the weight of the oil phase.

For emulsification, there may be used any of known emulsifiers such as homogenizers, and ultrasonic dispersers. After emulsification, the resultant emulsion is heated to a temperature of 30° to 70° C. so as to accelerate the reaction of forming the capsule wall. During the reaction, measures to prevent capsules from aggregating must be taken. Such measures include addition of water to a reaction system to thereby decrease the probability of collision of capsules and the sufficient stirring of the reaction system.

Also, during the reaction, a dispersant may be added to the reaction system to prevent aggregation. As the polymerization reaction progresses, carbon dioxide gas is generated. When the generation of carbon dioxide gas stops, it indicates that the reaction of forming the capsule wall is substantially completed. Usually, after the reaction system undergoes the reaction for several hours, diazo compound-containing microcapsules are obtained.

In the present invention, the heat-sensitive recording layer contains a basic substance in order to accelerate the coupling reaction between the diazo compound and the coupler. Basic substances may be used singly or in combination. Examples of such basic substances include nitrogen-containing compounds such as tertiary amines, piperidines, piperazines, amidines, formamidines, pyridines, guanidines, and morpholines.

Among these nitrogen-containing compounds, particularly preferable are piperazines such as N,N'-bis(3-phenoxy-2-hydroxypropyl)piperazine, N,N'-bis [3-(p-methylphenoxy)-2-hydroxypropyl]piperazine, N,N'-bis[3-(p-methoxyphenoxy)-2-hydroxypropyl]piperazine, N,N'-bis (3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, and 1,4-bis {[3-(N-methylpiperazino)-2-hydroxy] propyloxy}benzene; morpholines such as N-[3-(β-naphthoxy)-2-hydroxy]propylmorpholine, 1,4-bis[(3-morpholino-2-hydroxy)propyloxy]benzene, and 1,3-bis [(3-morpholino-2-hydroxy)propyloxy]benzene; piperidines such as N-(3-naphenoxy-2 -hydroxypropyl)piperidine and N-dodecylpiperidine; and guanidines such as triphenylguanidine, tricyclohexylguanidine, and dicyclohexylphenylguanidine.

In the present invention, a coupler component and a basic substance are preferably used in an amount of 0.1 to 30 parts by weight each based on 1 part by weight of a diazo compound.

In the present invention, the heat-sensitive recording layer may contain a color-developing aid for accelerating the color-developing reaction in addition to the above-described basic substance.

Color-developing aids include substances which increase color density during recording through application of heat and substances which lower the minimum color-developing temperature. They function to lower the melting points of the coupler, basic substance, and diazo compound, lower the softening point of the capsule wall, or improve the thermal permeability of the capsule wall, to thereby provide conditions that allow the diazo compound, the basic substance, the coupler, etc. to react with ease.

For example, in order to quickly and completely heat-develop the heat-sensitive recording material at low energy consumption, there may be added as color-developing aids phenol derivatives, naphthol derivatives, alkoxy-substituted benzenes, alkoxy-substituted naphthalenes, hydroxy compounds, amide compounds, and sulfonamide compounds.

Color-developing aids which may be used in the present invention also include heat-meltable substances. Heat-meltable substances are solid at normal temperature and melt when heated to their melting points of 50° to 150° C. These heat-meltable substances melt diazo compounds, couplers, basic substances, and the like. Such heat-meltable substances include, for example, carboxylic acid amides, N-substituted carboxylic acid amides, ketone compounds, urea compounds, and esters.

The heat-sensitive recording material of the present invention preferably contains a known antioxidant in order to improve light- and heat-fastness of a thermally color-developed image or lessen the tendency for a fixed non-image area to turn yellowish. Such antioxidants are disclosed, for example, in European Patent Nos. 223739, 309401, 309402, 310551, 310552, and 459416, German Patent No. 3435443, Japanese Patent Application Laid-Open (JP-A) Nos. 54-48535, 62-262047, 63-113536, 63-163351, 2-262654, 2-71262, 3-121449, 5-61166, and 5-119449, and U.S. Pat. Nos. 4814262 and 4980275.

Further, known antioxidants used in heat- and pressure-sensitive recording materials may also be used in the present invention. Such antioxidants are disclosed, for example, in Japanese Patent Application Laid-Open (JP-A) Nos. 60-107384, 60-107383, 60-125470, 60-125471, 60-125472, 60-287485, 60-287486, 60-287487, 60-287488, 61-160287, 61-185483, 61-211079, 62-146678, 62-146680, 62-146679, 62-282885, 63-051174, 63-89877, 63-88380, 63-088381, 63-203372, 63-224989, 63-251282, 63-267594, 63-182484, 01-239282, 04-291685, 04-291684, 05-188687, 05-188686, 05-110490, 05-1108437, and 05-170361, and Japanese Patent Application Publication (JP-B) Nos. 48-043294 and 48 -033212.

Specific examples of such antioxidants include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,24-trimethyl-1,2,3,4-tetrahydroquinoline, 6-ethoxy-1-octyl-2,2,4-trimethyl-1,2,3,4-tetrahydroquinoline, cyclohexoic acid nickel, 2,2-bis-4-hydroxyphenylpropane, 1,1-bis-4-hydroxyphenyl-2-ethylhexane, 2-methyl-4-methoxy-diphenylamine, and 1-methyl-2-phenylindole.

The amount of these antioxidants preferably ranges from 0.05 to 100 parts by weight, particularly preferably from 0.2 to 30 parts by weight, based on 1 part by weight of a diazo compound.

Each of the above-described known antioxidants, together with a diazo compound, may be contained in a microcapsule, or may be used with a coupler, a basic substance, and a color-developing aid in a solid dispersion form or with an adequate emulsifying aid in an emulsified form, or may be used both in a solid dispersion form and in an emulsified form. These antioxidants may be used singly or in combination. An antioxidant may be added to a protective layer.

When the heat-sensitive recording material of the present invention comprises a plurality of layers, these antioxidants may be added to different layers. When these antioxidants are used in combination and are classified into the structural groups of anilines, alkoxybenzenes, hindered phenols, hindered amines, hydroquinone derivatives, phosphorus compounds, and sulfur compounds, the antioxidants to be combined may be selected from among different groups or the same group.

A coupler used in the present invention may be solidly dispersed with a basic substance, a color-developing aid, etc. in a water-soluble polymer through use of a sand mill or the like, but is particularly preferably used with an adequate emulsifying aid in an emulsified form.

The above-described water-soluble polymer is preferably that used for preparing microcapsules (a water-soluble polymer disclosed, for example, in Japanese Patent Application Laid-Open (JP-A) No. 59-190886). In this case, each of a coupler, a basic substance, and a color-developing aid is added in an amount of 5 to 40 wt. % into a water-soluble polymer solution. Each of the dispersed or emulsified particles has preferably a size of less than or equal to 10 μm.

In order to lessen the tendency for a fixed non-image area to turn yellowish, the heat-sensitive recording material of the present invention may contain a free-radical-generating agent (a compound which generates a free radical upon irradiation with light) used in a photo polymerizing composition or the like. Such free-radical-generating agents include aromatic ketones, quinones, benzoin, benzoin ethers, azo compounds, organic disulfides, and acyloxime esters. The amount of a free-radical-generating agent added preferably ranges from 0.01 to 5 parts by weight based on 1 part by weight of a diazo compound.

Also, in order to lessen the tendency to turn yellowish, the heat-sensitive recording material of the present invention may contain a polymerizable compound having an ethylenic unsaturated bond (hereinafter referred to as a vinyl monomer). A vinyl monomer is a compound having in its chemical structure at least one ethylenic unsaturated bond (vinyl group, vinylidene group, etc.) and has the chemical form of a monomer or prepolymer. Examples of a vinyl monomer include unsaturated carboxylic acid and its salt, an ester of unsaturated carboxylic acid and aliphatic polyhydric alcohol, and an amide compound of unsaturated carboxylic acid and aliphatic polyvalent amine.

A vinyl monomer is preferably used in an amount of 0.2 to 20 parts by weight based on 1 part by weight of a diazo compound.

The above-mentioned free-radical-generating agent and vinyl monomer, together with a diazo compound, may be contained in microcapsules.

The heat-sensitive recording material of the present invention may contain citric acid, tartaric acid, oxalic acid, boric acid, phosphoric acid, pyrophosphoric acid, or the like as an acid stabilizer in addition to the above-described substances.

The heat-sensitive recording material of the present invention is manufactured by the steps of preparing a coating solution which contains a diazo compound-containing microcapsule, a coupler, a basic substance, and an additive, applying the prepared coating solution to a support made of paper, a synthetic resin film, or the like by a bar coating method, a blade coating method, an air knife coating method, a gravure coating method, a roll coating method, a spray coating method, a dip coating method, a curtain coating method, or the like, and drying the applied coating. The solid content of the heat-sensitive recording layer is preferably 2.5 to 30 g/$m^2$.

In the heat-sensitive recording material of the present invention, the heat-sensitive recording layer may assume a single layer form, in which a microcapsule, a coupler, a base, etc. are contained in the same layer, or a multilayer form, in which these substances are contained in different layers. Alternatively, an intermediate layer as disclosed in Japanese Patent Application No. 59-177669 may be provided on a support, and subsequently a heat-sensitive recording layer may be applied onto the intermediate layer.

Examples of the support used in the present invention include ordinary pressure-sensitive paper and heat-sensitive paper; a paper support used in dry or wet diazo copying paper; neutralized paper (pH 5 to 9) (disclosed in Japanese Patent Application No. 55-14281) sized by a neutral sizing agent such as alkyl ketene dimer or the like; paper disclosed in Japanese Patent Application Laid-Open (JP-A) No. 57-116687 which paper satisfies the relation between a Steckigt sizing degree and a metric basis weight as described in the publication and has a Bech smoothness of not less than 90 seconds; paper disclosed in Japanese Patent Application Laid-Open (JP-A) No. 58-136492 which paper has an optical surface roughness of less than or equal to 8 μm and a thickness of 30 to 150 μm; paper disclosed in Japanese Patent Application Laid-Open (JP-A) No. 58-69091 which paper has a density of less than or equal to 0.9 g/$cm^3$ and an optical contact percentage of greater than or equal to 15%; paper disclosed in Japanese Patent Application Laid-Open (JP-A) No. 58-69097 which paper is made from pulp beaten so as to obtain a Canadian standard freeness (JIS P8121) of greater then or equal to 400 cc and is processed so as to prevent a coated liquid from permeating; paper disclosed in Japanese Patent Application Laid-Open (JP-A) No. 58-65695 whose color density and resolution are improved through use of the glossy side of untreated paper made by a Yankee machine; and paper disclosed in Japanese Patent Application Laid-Open (JP-A) No. 59-35985 whose coating properties are improved by subjecting untreated paper to a corona discharge process.

A synthetic resin film used as a support in the present invention may be selected from among known materials which do not deform upon exposure to heat applied in the developing process and stably maintain dimensions thereof. Examples of such a film include polyester films such as polyethylene terephthalate films and polybutylene terephthalate films; cellulose derivative films such as triacetate cellulose films; polystyrene films; polyolefin films such as polypropylene films, and polyethylene films. These films may be used singly or in a layered form. The support thickness is generally 20 to 200 μm.

The heat-sensitive recording material of the present invention further comprises a protective layer, which contains polyvinyl alcohol as a main component and additives such as various pigments and a release agent, provided on the heat-sensitive recording layer in order to prevent sticking and staining of thermal heads during printing with the thermal head and to improve the water resistance of the heat-sensitive recording material.

When the recording surface of the thus-obtained heat-sensitive recording material of the present invention is heated by thermal heads or the like, the capsule wall formed of polyurea or polyurethane softens, so that couplers and basic substances, outside the capsules, can enter the capsules to thereby develop color through reaction of the couplers with the diazo compounds. After recording, the heat-sensitive recording material is irradiated with light having a wavelength to be absorbed by the diazo compound, thereby decomposing the diazo compound. This causes the diazo compound to lose reactivity, thus fixing the image.

Light sources used for fixing images include fluorescent lamps, xenon lamps, and mercury lamps. Preferably, the spectrum of light emitted from the light source substantially correspond to the absorption spectrum of the diazo compound used in the heat-sensitive recording material in order to efficiently fix an image through irradiation with light.

Also, the contents of an original document or the like may be recorded as a latent image on the heat-sensitive recording material of the present invention through exposure to thereby decompose the diazo compounds in non-image areas. Subsequently, the heat-sensitive recording material is developed through application of heat to thereby obtain an image.

The heat-sensitive recording material of the present invention may be a multicolor heat-sensitive recording material.

Multicolor heat-sensitive recording materials (photosensitive heat-sensitive recording materials) are disclosed, for example, in Japanese Patent Application Laid-Open (JP-A) Nos. 4-135787, 4-144784, 4-144785, 4-194842, 4-247447, 4-247448, 4-340540, 4-340541, and 5 -34860. A multicolor heat-sensitive recording material comprises heat-sensitive recording layers which develop different hues. The layered structure is not particularly limited. However, a multicolor heat-sensitive recording material preferably comprises two heat-sensitive recording layers (layers B and C) which respectively contain different diazo compounds having different absorption wavelengths and corresponding couplers which react with the diazo compounds through application of heat to thereby develop different hues and a heat-sensitive recording layer which contains an electron donative colorless dye and an electron acceptive compound. For example, a multicolor heat-sensitive recording material comprises a first heat-sensitive recording layer (layer A) which is provided on a support and contains an electron donative colorless dye and an electron acceptive compound, a second heat-sensitive recording layer (layer B) which contains a diazo compound having a maximal absorption wavelength of 360±20 nm and a coupler which reacts with the diazo compound through application of heat to thereby develop color, and a third heat-sensitive recording layer (layer C) which contains a diazo compound having a maximal absorption wavelength of 400±20 nm and a coupler which reacts with the diazo compound through application of heat to thereby develop color. In this example, a hue to be developed in each heat-sensitive recording layer may be selected so as to be each of three primary colors in a subtractive color process, i.e. yellow, magenta, and cyan, thereby recording an image in full color.

An image is recorded on this multicolor heat-sensitive recording material in the following manner. First, the third heat-sensitive recording layer (layer C) is heated so as to develop color through reaction of the diazo compound contained therein with a coupler contained therein. Next, the multicolor heat-sensitive recording material is irradiated with light having a wavelength of 400±20 nm so as to decompose the unreacted diazo compounds contained in the layer C. Subsequently, the second heat-sensitive recording layer (layer B) is sufficiently heated so as to develop color through reaction of the diazo compound contained therein with the coupler contained therein, thereby causing layer B to develop color. At this time, layer C is also intensely heated but does not develop color any more since the diazo compound contained in layer C has already decomposed and thus has lost its color-developing capability. Further, the multicolor heat-sensitive recording material is irradiated with light having a wavelength of 360±20 nm so as to decompose unreacted diazo compound contained in layer B. Lastly, the first heat-sensitive recording layer (layer A) is sufficiently heated, thereby causing layer A to develop color. At this time, the layers C and B are also intensively heated but do not develop color any more since the diazo compounds contained in layers C and B are already decomposed and thus have lost their color-developing capability. The heat-sensitive recording material of the present invention is preferably a multicolor heat-sensitive recording material as described above.

When the heat-sensitive recording material of the present invention is a multicolor heat-sensitive recording material, an intermediate layer may be provided between heat-sensitive recording layers so as to prevent color mixing therebetween. This intermediate layer is formed of a water-soluble polymer compound such as gelatin, phthalated gelatin, polyvinyl alcohol, polyvinyl pyrrolidone, or the like and may contain appropriate additives. A coating solution for the intermediate layer is preferably applied in an amount of 2 to 10 g/m$^2$, more preferably 4 to 5 g/m$^2$. The intermediate layer preferably has a thickness of 0.5 to 10 $\mu$m.

The present invention will next be described by way of example, which should not be construed as limiting the invention.

EXAMPLES

Example 1

(1) Preparation of diazo heat-sensitive recording material

Preparation of diazo compound-containing capsule solution A

A diazo compound (A-3) (2.8 parts by weight) described in this specification and tricresyl phosphate (10 parts by weight) were uniformly mixed with ethyl acetate (19 parts by weight). The resultant mixture, and TAKENATE D-110N (manufactured by Takeda Chemical Industries, Ltd.) (7.6 parts by weight) used as the material for the capsule wall were uniformly mixed, to thereby obtain a solution I.

Next, an 8 wt. % aqueous phthalated gelatin solution (46.1 parts by weight), water (17.5 parts by weight), and a 10% aqueous sodium dodecylbenzenesulfonate solution (2 parts by weight) were added to the solution I. The resultant mixture was emulsified for 10 minutes at a temperature of 40° C. and a rotational speed of 10,000 r.p.m. The obtained emulsion and water (20 parts by weight) were homogenized. The resultant mixture was stirred and heated for 3 hours at a temperature of 40° C. to hereby perform an encapsulation reaction, obtaining capsule solution A. The diameter of the capsules was 0.85 $\mu$m.

Preparation of coupler emulsion B

In ethyl acetate (10.5 parts by weight) were dissolved a pyrazolone compound (B-1) (3.0 parts by weight) described in this specification, 1,1-(p-hydroxyphenyl)-2-ethylhexane (4.0 parts by weight), 4,4'-(p-phenylene diisopropylidene) diphenol (8.0 parts by weight), triphenylguanidine (4.0 parts by weight), tricresyl phosphate (0.64 parts by weight), and diethyl maleate ester (0.32 parts by weight), to thereby obtain solution II.

A 15 wt. % aqueous lime-treated gelatin solution (49.1 parts by weight), a 10% aqueous soda dodecylbenzenesulfonate solution (9 parts by weight), and water (35 parts by weight) were uniformly mixed. Solution II was added to the resultant mixture, followed by emulsification for 10 minutes at a temperature of 40° C. and a rotational speed of 10,000 r.p.m. through use of a homogenizer. The obtained emulsion was stirred for 2 hours at a temperature of 40° C. to thereby remove ethyl acetate. Subsequently, the resultant emulsion was replenished with water having the same weight as that of the removed ethyl acetate and water, to thereby obtain a coupler/base emulsion B.

Preparation of coating solution C

The capsule solution A (6 parts by weight), water (4.4 parts by weight), and a 15 wt. % aqueous lime-treated gelatin solution (1.9 parts by weight) were uniformly mixed. The resultant mixture and the coupler/base emulsion B (8.3 parts by weight) were uniformly mixed, to thereby obtain a heat-sensitive recording layer coating solution C.

Preparation of protective layer coating solution D

A 10% aqueous solution (32 parts by weight) of polyvinyl alcohol (degree of polymerization: 1700; degree of saponification: 88%) and water (36 parts by weight) were uniformly mixed, to thereby obtain a protective layer coating solution D.

Application

The heat-sensitive recording layer coating solution C and the protective layer coating solution D were sequentially applied to a support for photographic printing paper, i.e. wood free paper laminated with polyethylene, followed by drying at a temperature of 50° C. after each application. In this way the diazo heat-sensitive recording material was obtained. The solutions C and D were applied in an amount (weight of solid matter) of 6.4 g/m$^2$ and 1.05 g/m$^2$ respectively.

(2) Recording of image

Thermal recording

Power and a pulse width were determined so as to obtain a recording energy per unit area of 0 to 40 mJ/mm$^2$. The thus determined power was applied in pulses to a thermal head (model KST) manufactured by Kyocera Corp., thereby thermally forming an image on the heat-sensitive recording layer.

Light fixation

After thermal recording, the entire surface of the heat-sensitive recording material was irradiated for 15 seconds with light emitted from an ultraviolet lamp with an output of 40 W and emitting light having a center wavelength of 365 nm.

(3) Performance test on image-recorded paper

Color hue of image

The color hue of image-recorded paper was evaluated through measurement of a maximal absorption wavelength (nm) by a spectrophotometer (reflection) and visual observation. When a maximal absorption wavelength falls within the range of 530 to 540 nm, the hue of the image recorded on the heat-sensitive recording material is a satisfactory magenta unless the waveform of the absorption spectrum is significantly different from that of magenta.

Raw storage storability test

A heat-sensitive recording material was stored for 72 hours at a temperature of 60° C. and a humidity of 30% RH before image recording. Subsequently, an image was recorded on the heat-sensitive recording material. Then, the magenta density $M_1$ of the image area and the yellow density $Y_1$ of the non-image area were measured with a Macbeth reflection densitometer.

An image was recorded on a heat-sensitive recording material not subjected to the above-described before-use storability test. Subsequently, the magenta density $M_0$ of the image area and the yellow density $Y_0$ of the non-image area were measured by a Macbeth reflection densitometer.

Thus, density changes ($M_1$–$M_0$) and ($Y_1$–$Y_0$) between before and after the before-use storability test were obtained for the image area and the non-image area, respectively. The smaller the change in density, the better the raw stock storability of the heat-sensitive recording material before recording.

Light-fastness test

Reflection density was measured for the image and non-image areas of an image-recorded heat-sensitive recording material using a Macbeth reflection densitometer. Next, this heat-sensitive recording material was irradiated with light for 72 hours using a light-fastness testing apparatus having a 32,000 lux fluorescent lamp. Subsequently, the reflection density was measured for the image and non-image areas of this heat-sensitive recording material by the Macbeth reflection densitometer. Then, the density change between before and after irradiation with light was obtained for the image and non-image areas. For evaluation of the density change for the image area, the density change at the portion of the image area where an initial reflection density was approximately 1.1 was used.

Examples 2 to 13

Heat-sensitive recording materials were obtained and evaluated in a manner similar to that described in Example 1 except that in place of the coupler (B-1) used in Example 1, couplers (B-2), (B-3), (B-4), (B-5), (B-11), (B-19), (B-21), (B-29), (B-44), (B-46), (B-50), and (B-56) were used to obtain respective coupler emulsions.

Comparative Examples 1 to 3

Heat-sensitive recording materials were obtained and evaluated in a manner similar to that described in Example 1 except that in place of the coupler (B-1), the following compounds A, B, and C were used to obtain respective coupler emulsions.

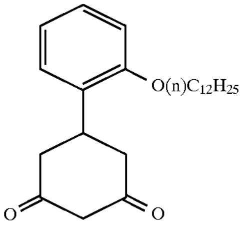

(Compound A)

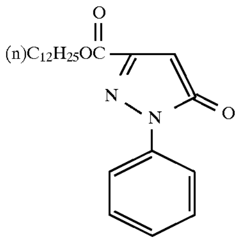

(Compound B)

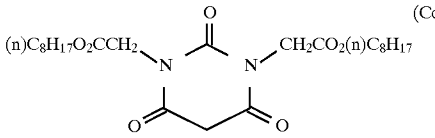

(Compound C)

Examples 14.to 17

Heat-sensitive recording materials were obtained and evaluated in a manner similar to that of Example 1 except that in place of the diazo compound (A-3)used in Example 1, diazo compounds (A-18), (A-7), (A-6), and (A-4) were used to obtain respective capsule solutions.

Comparative Examples 4 to 9

Heat-sensitive recording materials were obtained and evaluated in a manner similar to that described in Example 1 except that in place of the diazo compound (A-3) and the coupler (B-1) used in Example 1, the following diazo compound D or E and the above-described coupler compounds A, B, and C were used in the following combinations to obtain respective coupler emulsions and capsule solutions.

| | Diazo compound | Coupler |
|---|---|---|
| Comparative Example 4 | Compound D | Compound A |
| Comparative Example 5 | Compound D | Compound B |
| Comparative Example 6 | Compound D | Compound C |
| Comparative Example 7 | Compound E | Compound A |
| Comparative Example 8 | Compound E | Compound B |
| Comparative Example 9 | Compound E | Compound C |

(Compound D)

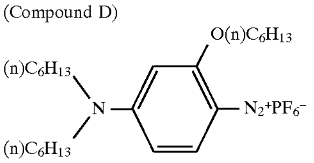

(Compound E)

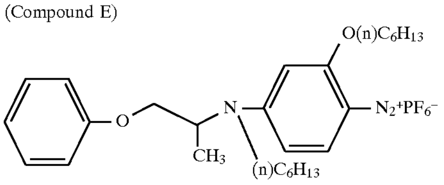

Tables below show the performance test results of heat-sensitive recording materials.

Table 1-1 and 1-2 below shows the color hues of the image area.

TABLE 1-1

Color Hue of Image Area

| | λ max | Color hue |
|---|---|---|
| Example 1 | 538 | Magenta |
| Example 2 | 538 | Magenta |
| Example 3 | 538 | Magenta |
| Example 4 | 538 | Magenta |
| Example 5 | 538 | Magenta |
| Example 6 | 535 | Magenta |
| Example 7 | 537 | Magenta |

TABLE 1-2

Color Hue of Image Area

| | λ max | Color hue |
|---|---|---|
| Example 8 | 538 | Magenta |
| Example 9 | 537 | Magenta |
| Example 10 | 537 | Magenta |
| Example 11 | 538 | Magenta |
| Example 12 | 535 | Magenta |
| Example 13 | 536 | Magenta |
| Example 14 | 541 | Magenta |
| Example 15 | 532 | Magenta |
| Example 16 | 528 | Magenta |
| Example 17 | 533 | Magenta |
| Comp. Example 1 | 437 | Orange |
| Comp. Example 2 | 543 | Claret |
| Comp. Example 3 | 485 | Orange |
| Comp. Example 4 | 530 | Magenta |
| Comp. Example 5 | 570 | Purple |
| Comp. Example 6 | 538 | Magenta |
| Comp. Example 7 | 532 | Magenta |
| Comp. Example 8 | 568 | Purple |
| Comp. Example 9 | 530 | Magenta |

Table 2-1 and 2-2 below shows the results of the raw stock storability test.

TABLE 2-1

Raw Storage Stability of Image and Non-image Areas

| | Density change in image area | Density change in non-image area |
|---|---|---|
| Example 1 | −0.08 | 0.00 |
| Example 2 | −0.07 | 0.00 |
| Example 3 | −0.08 | 0.00 |
| Example 4 | −0.07 | +0.01 |
| Example 5 | −0.08 | 0.00 |
| Example 6 | −0.07 | 0.00 |
| Example 7 | −0.08 | 0.00 |
| Example 8 | −0.07 | +0.01 |
| Example 9 | −0.08 | 0.00 |
| Example10 | −0.08 | 0.00 |
| Example11 | −0.07 | +0.01 |
| Example12 | −0.08 | +0.01 |
| Example13 | −0.08 | +0.01 |

TABLE 2-2

Raw Storage Stability of Image and Non-image Areas

| | Density change in image area | Density change in non-image area |
|---|---|---|
| Comp. Example 1 | −0.09 | +0.01 |
| Comp. Example 2 | −0.08 | +0.01 |
| Comp. Example 3 | −0.13 | +0.01 |
| Comp. Example 4 | −0.16 | +0.10 |
| Comp. Example 5 | −0.15 | +0.09 |
| Comp. Example 6 | −0.15 | +0.11 |
| Comp. Example 7 | −0.14 | +0.07 |
| Comp. Example 8 | −0.14 | +0.08 |
| Comp. Example 9 | −0.15 | +0.08 |

Table 3-1 and 3-2 below shows the results of the light-fastness test.

TABLE 3-1

Light-fastness of Image and Non-image Areas

| | % of Residual image area | Density change in non-image area |
|---|---|---|
| Example 1 | 95 | +0.01 |
| Example 2 | 92 | +0.01 |
| Example 3 | 92 | +0.01 |
| Example 4 | 94 | +0.02 |
| Example 5 | 93 | 0.00 |
| Example 6 | 93 | +0.01 |
| Example 7 | 92 | +0.01 |
| Example 8 | 92 | +0.02 |
| Example 9 | 96 | +0.01 |
| Example 10 | 94 | +0.01 |
| Example 11 | 92 | +0.02 |
| Example 12 | 94 | +0.01 |
| Example 13 | 93 | +0.02 |

TABLE 3-2

Light-fastness of Image and Non-image Areas

| | % of Residual image area | Density change in non-image area |
|---|---|---|
| Comp. Example 1 | 68 | +0.03 |
| Comp. Example 2 | 98 | +0.04 |
| Comp. Example 3 | 94 | +0.03 |

TABLE 3-2-continued

Light-fastness of Image and Non-image Areas

| | % of Residual image area | Density change in non-image area |
|---|---|---|
| Comp. Example 4 | 68 | +0.05 |
| Comp. Example 5 | 95 | +0.06 |
| Comp. Example 6 | 94 | +0.05 |
| Comp. Example 7 | 68 | +0.06 |
| Comp. Example 8 | 95 | +0.06 |
| Comp. Example 9 | 94 | +0.06 |

These test results have revealed that the heat-sensitive recording materials of the present invention using a pyrazolone compound and a diazo compound provide a magenta image, excellent light-fastness with image and non-image areas, and excellent raw stock storability with good maintenance of texture whiteness. By contrast, Comparative Examples using a pyrazolone compound having a structure similar to that of a pyrazolone compound used in the present invention fail to provide consistent hue, have low raw stock storability, particularly low raw storage storability of the white portion, and insufficient light-fastness.

Example 18

Next will be described an example of the multilayer multicolor heat-sensitive recording material of the present invention capable of reproducing an image in fill color through thermal recording of the three colors, yellow, magenta, and cyan, in different layers.

(1) Preparation of a coating solution for a heat-sensitive cyan-developing layer (layer A)

(Preparation of a capsule solution containing an electron donative colorless dye)

1. Layer A-1

An indolylphthalide compound as an electron donative colorless dye, [3-(4-di-n-propylaminophenyl-2-acetylaminophenyl)-3-(1-ethyl-2-methylindole-3-yl)-4-azaphthalide] (3 parts by weight) was dissolved in ethyl acetate (20 parts by weight). To the resultant solution was added alkylnaphthalene (diisopropylnaphthalene: high boiling point solvent) (20 parts by weight). The resultant mixture was uniformly mixed while being heated.

To the thus-obtained solution was added a 1:3 adduct of xylylene diisocyanato/trimethylolpropane (TAKENATE D-110N manufactured by Takeda Chemical Industries, Ltd.) (20 parts by weight). The resultant mixture was homogeneously stirred, yielding an electron donative colorless dye solution.

2. Layer A-2

A 2 wt. % aqueous sodium dodecylsulfonate solution (2 parts by weight) was added to a 6% aqueous phthalic gelatin solution (54 parts by weight). To the thus-prepared solution was added the above-described electron donative colorless dye solution. The resultant mixture was emulsified through use of a homogenizer. The obtained emulsion and water (68 parts by weight) were mixed. The resultant mixture was heated to a temperature of 50° C. while stirring, followed by an encapsulation reaction performed for 3 hours so as to obtain a mean microcapsule diameter of 1.6 μm, thereby obtaining a capsule solution.

(Preparation of an electron acceptive compound emulsion)

Bisphenol P, the electron acceptive compound, was added to a 4% aqueous polyvinyl alcohol solution (150 parts by weight). The resultant mixture was dispersed for 24 hours through use of a ball mill, to thereby prepare a dispersion.

The dispersion was added to a mixed solution of a 15% aqueous phthalic gelatin solution (45 parts by weight) and a 10% aqueous sodium dodecylsulfonate solution (5 parts by weight). The resultant mixture was emulsified for 10 minutes through use of a homogenizer, to thereby obtain an emulsion.

(Preparation of a coating solution)

The capsule solution, which contains an electron donative colorless dye, and the electron acceptive compound emulsion were mixed at a weight ratio of 1:4, to thereby obtain a coating solution.

(2) Preparation of a coating solution for a heat-sensitive magenta-developing layer (layer B)

(Preparation of a capsule solution containing a diazo compound)

The diazo compound (A-3) (which is decomposed by light having a wavelength of 365 nm) (2.0 parts by weight) was dissolved in ethyl acetate (20 parts by weight). Alkylnaphthalene (20 parts by weight) was added to the resultant solution. The obtained mixture was uniformly mixed while heating. The resultant solution and TAKENATE D-110N (the material for the capsule wall) (15 parts by weight) were uniformly mixed, to thereby obtain a diazo compound solution.

This diazo compound solution was added to a mixed solution of a 6% aqueous solution (54 parts by weight) of polyvinyl alcohol (degree of polymerization: 1700;.degree of saponification: 88%) and a 2% aqueous sodium dodecylsulfonate solution (2 parts by weight). The resultant mixture was emulsified through use of a homogenizer.

The thus-obtained emulsion and water (68 parts by weight) were uniformly mixed. The resultant mixture was heated to a temperature of 40° C. while stirring, followed by an encapsulation reaction performed for 3 hours so as to obtain a mean microcapsule diameter of 1.1 μm, thereby obtaining a capsule solution.

(Preparation of a coupler emulsion)

The coupler (B-1) (2 parts by weight), 1,2,3-triphenylguanidine(2 parts by weight), tricresyl phosphate (0.3 parts by weight), and diethyl maleate (0.1 parts by weight) were dissolved in ethyl acetate (10 parts by weight). The resultant solution was added to a mixed aqueous solution of a 6 wt. % aqueous gelatin solution (50 g) and a 2% aqueous sodium dodecylsulfonate solution (2 g). The resultant mixture was emulsified for 10 minutes through use of a homogenizer, to thereby obtain an emulsion.

(Preparation of a coating solution)

The capsule solution, which contains a diazo compound, and the coupler emulsion were mixed at a weight ratio of 2:3, to thereby obtain a coating solution.

(3) Preparation of a coating solution for a heat-sensitive yellow-developing layer (layer C)

(Preparation of a capsule solution containing a diazo compound)

2,5-dibutoxy-4-tolylthiobenzene diazonium hexafluorophosphate (a diazo compound which is decomposed by light having a wavelength of 420 nm) (3.0 parts by weight) was dissolved in ethyl acetate (20 parts by weight). To the resultant solution was added alkylnaphthalene (20 parts by weight) as a high boiling point solvent. The resultant mixture was uniformly mixed while heating. The obtained solution and TAKENATE D-110N (15 parts by weight) used as the material for the capsule wall, were uniformly mixed to thereby obtain a diazo compound solution.

The obtained diazo compound solution was added to a mixed solution of a 6% aqueous phthalic gelatin solution (54 parts by weight) and an aqueous sodium dodecylsulfonate solution (2 parts by weight). The resultant mixture was emulsified through use of a homogenizer. The obtained emulsion and water (68 parts by weight) were uniformly mixed. The resultant mixture was heated to a temperature of 40° C. while stirring, followed by an encapsulation reaction performed for 3 hours so as to obtain a mean microcapsule diameter of 1.3 μm, thereby obtaining a capsule solution.

(Preparation of a coupler emulsion)

2-chloro-5-(3-(2,4-di-t-pentyl)phenoxypropyl)-acetanilide (2 parts by weight), the chroman derivative (B-3) (2 parts by weight), 1,2,3-triphenylguanidine (1 part by weight), tricresyl phosphate (0.3 parts by weight), and diethyl maleate (0.1 parts by weight) were dissolved in ethyl acetate (10 parts by weight). The resultant solution was added to a mixed aqueous solution of a 6 wt. % aqueous gelatin solution (50 g) and a 2% aqueous sodium dodecylsulfonate solution (2 g). The resultant mixture was emulsified for 10 minutes through use of a homogenizer, to thereby obtain an emulsion.

(Preparation of a coating solution)

The capsule solution, which contains a diazo compound, and the coupler emulsion were mixed at a weight ratio of 2:3, to thereby obtain a coating solution.

(4) Preparation of an intermediate coating solution

A 24 wt. % aqueous solution of gelatin (#750 manufactured by Nitta Gelatin Co., Ltd.) and a hollow capsule made of an acrylic acid-styrene resin (LOPAKE OP-62 manufactured by Rohm and Haas Co.) (2.4 g) were uniformly mixed, to thereby obtain an intermediate layer coating solution.

(5) Preparation of a protective layer coating solution

A 6% aqueous solution (100 g) of itaconic acid modified polyvinyl alcohol (KL-318 manufactured by Kuraray Co., Ltd.) and a 30% dispersion (10 g) of epoxy-modified polyamide (FL-71 manufactured by Toho Chemical Co., Ltd.) were mixed. To the resultant mixture was added a 40% zinc stearate dispersion (Hydrin Z manufactured by Chukyo Oil and Fat Co., Ltd.) (15 g), to thereby obtain a protective layer coating solution.

Preparation of a back layer coating solution:

A 4% aqueous gelatin solution (1,200 g) was used as a back layer coating solution.

Preparation of a support provided with undercoat layers:

SBR latex was applied in a weight of solid matter of 0.3 g/$m^2$ to both sides of a polyethylene terephthalate sheet having a thickness of 175 βm. Subsequently, an undercoat layer coating solution, which will be described below, was applied to both sides in an amount 0.1 g/$m^2$ of one side reduced to solid content, to thereby obtain a support provided with undercoat layers.

Preparation of an undercoat layer coating solution:

A 5% aqueous gelatin solution (#810 manufactured by Nitta Gelatin Co., Ltd.) (200 g), a gelatin dispersion system (0.5 g) in which polymethyl methacrylate resin particles having a grain size of 2 μm were dispersed in an amount of 5%, a 3% aqueous 1,2-benzothiazoline-3-on solution (1.0 g), and a 2% aqueous di(2-ethyl)hexyl sulfonate solution (10 g) were mixed, to thereby obtain an undercoat layer coating solution.

(6) Preparation of a multicolor heat-sensitive recording material

The above-prepared back layer coating solution was applied in a weight of solid matter of 1.8 g/$m^2$ (a thickness of 10 μm after drying) to a single side of the transparent support provided with undercoat layers, followed by drying.

Next, a heat-sensitive cyan-developing layer solution, an intermediate layer solution, a heat-sensitive magenta-developing layer solution, an intermediate layer solution, a heat-sensitive yellow-developing layer solution, and a protective layer solution were applied in this order to the other side of the support by using a bead spraying apparatus having a slide type hopper, followed by drying and thus obtaining a multicolor heat-sensitive recording material.

Each of these coating solutions was applied in such an amount that after drying, solid matter was spread in the following amounts: heat-sensitive cyan-developing layer 6.1 g/$m^2$; heat-sensitive magenta-developing layer 7.8 g/$m^2$; intermediate layer (gelatin 1.2 g/$m^2$, hollow capsule 1.2 g/$m^2$) 2.4 g/$m^2$; heat-sensitive yellow-developing layer 7.2 g/$m^2$; and protective layer 2.0 g/$m^2$.

(7) Recording of image

An image was recorded on the above-obtained multicolor heat-sensitive recording material in the following manner.

A voltage to be applied and a pulse width for a thermal head, model KST (manufactured by Kyocera Corp.) were adjusted such that the thermal head provides thermal recording energy per unit area for obtaining a density of 0.5 for an image area as measured with a Macbeth densitometer. The thus-adjusted thermal head was powered to record a yellow image on the obtained recording material.

Next, this multicolor heat-sensitive recording material was exposed for 10 seconds to an ultraviolet lamp which emits light having a center wavelength of 420 nm and has an output of 40 W, thereby light-fixing the image recorded on the heat-sensitive yellow-developing layer. Subsequently, a voltage to be applied and a pulse width for the thermal head were adjusted such that the thermal head provides thermal recording energy per unit area for obtaining a density of 0.5 for an image area as measured with a Macbeth densitometer. The thus-adjusted thermal head was powered to record a magenta image on the recording material.

Next, this multicolor heat-sensitive recording material was exposed for 30 seconds to an ultraviolet lamp which emits light having a center wavelength of 365 nm and has an output of 40 W, thereby light-fixing the image recorded on the heat-sensitive magenta-developing layer. Subsequently, a voltage to be applied and a pulse width for the thermal head were adjusted such that the thermal head provides thermal recording energy per unit area for obtaining a density of 0.5 for an image area as measured with a Macbeth densitometer. The thus-adjusted thermal head was powered to record a cyan image on the recording material.

As a result, in addition to portions color-developed in yellow, magenta, and cyan, there are obtained portions color-developed in red attained by overlapping yellow and magenta, portions color-developed in blue attained by overlapping magenta and cyan, portions color-developed in green attained by overlapping yellow and cyan, and portions color-developed in black attained by overlapping yellow, magenta, and cyan. Thus, a multicolor image comprising these portions was obtained.

Examples 19 and 20

Multilayer multicolor heat-sensitive recording materials were obtained in a manner similar to that of Example 18 except that in place of the coupler (B-1) used in Example 18, couplers (B-2) and (B-50) were used for Examples 19 and 20, respectively. An image was recorded on the recording materials in a manner similar to that of Example 18.

Comparative Example 10

A multilayer multicolor heat-sensitive recording material was obtained in a manner similar to that of Example 18 except that in place of the coupler (B-1) and the diazo compound (A-3) used in Example 18, a compound C and a compound E were used, respectively. An image was recorded on the recording material in a manner similar to that of Example 18.

Images obtained in Examples 18 to 20 and Comparative Example 10 were tested for color hue, raw stock storability, and light-fastness in a manner similar to that of Example 1. However, the time of irradiation with fluorescent light was changed to 240 hours. Test results are shown in Tables 4 to 6 below.

Table 4 shows the hue of an image area.

TABLE 4

Color Hue of Image Area

| | λ max | Color hue |
|---|---|---|
| Example 18 | 538 | Magenta |
| Example 19 | 538 | Magenta |
| Example 20 | 535 | Magenta |
| Comp. Example 10 | 530 | Magenta |

Table 5 shows the results of the raw stock storability test.

TABLE 5

Raw Storage Stability of Image and Non-image Areas

| | Density change in image area | Density change in non-image area |
|---|---|---|
| Example 18 | −0.08 | 0.00 |
| Example 19 | −0.07 | 0.00 |
| Example 20 | −0.07 | +0.01 |
| Comp. Example 1 | −0.15 | +0.08 |

Table 6 shows the results of the light-fastness test.

TABLE 6

Light-fastness of Image and Non-image Areas

| | % of Residual image area | Density change in non-image area |
|---|---|---|
| Example 18 | 97 | +0.01 |
| Example 19 | 96 | +0.01 |
| Example 20 | 96 | +0.01 |
| Comp. Example 10 | 95 | +0.08 |

As seen from Tables 4 to 6, a full-color multilayer multicolor heat-sensitive recording material which contains a pyrazolone compound as represented by formula (1) can also provide an excellent magenta image and is excellent in raw stock storability and light-fastness with image and non-image areas.

What is claimed is:

1. A heat-sensitive recording material comprising a support and a heat-sensitive recording layer provided on the support, the heat-sensitive recording layer containing a diazo compound and a coupler, characterized in that the coupler contains at least one pyrazolone compound represented by the following formula (1):

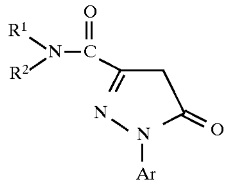

(1)

wherein Ar represents a phenyl group, a naphthyl group, or an aromatic heterocyclic group, any one of which may have a substituent bonded to the nucleus, said substituent may be a halogen atom, a cyano group, a trifluoromethyl group, an alkyl group, an aryl group, an alkoxycarbonyl group, a carbamoyl group, or a sulfamoyl group; $R^1$ and $R^2$ independently represent an alkyl group, an alkenyl group, or an aryl group, or $R^1$ and $R^2$ may be linked to each other so as to form a heterocycle.

2. The heat-sensitive recording material according to claim 1, containing as the diazo compound a diazo compound of the following formula (2):

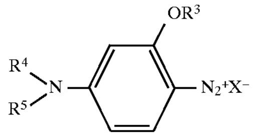

(2)

wherein each of $R^3$, $R^4$, and $R^5$ represents an alkyl group, an aralkyl group, or an aryl group, and $R^4$ and $R^5$ may form a ring together with a nitrogen atom; and $X^-$ represents an acid anion.

3. The heat-sensitive recording material according to claim 2, wherein the diazo compound is represented by the following structural formula:

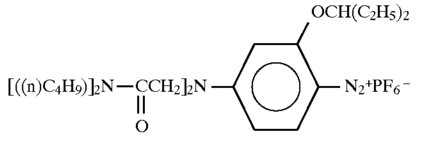

4. The heat-sensitive recording material according to any one of claims 1 through 3, wherein the diazo compound is encapsulated in a microcapsule.

5. The heat-sensitive recording material according to any one of claims 1 through 3, wherein the pyrazolone compound is represented by any one of the following structural formulas (B-1) through (B-5), (B-11), (B-19), (B-21), (B-29), (B-44), (B-46), (B-50), or (B-56);

B-1

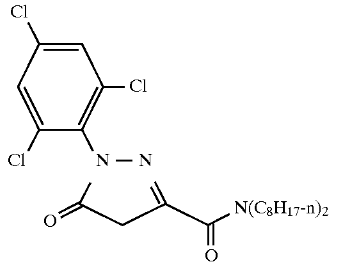

-continued
B-2
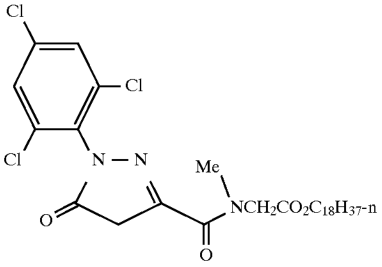
B-3
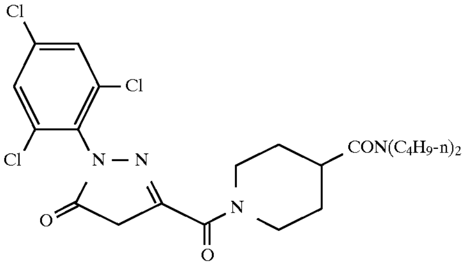
B-4
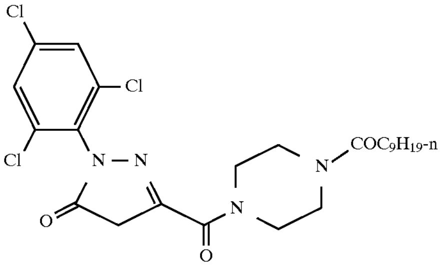
B-5
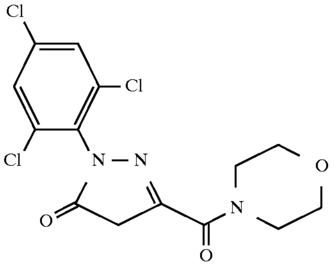
B-11
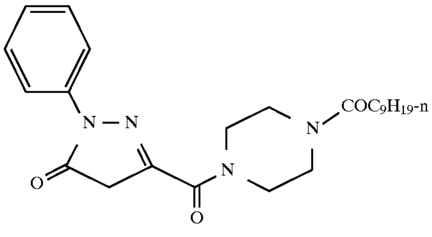
B-19
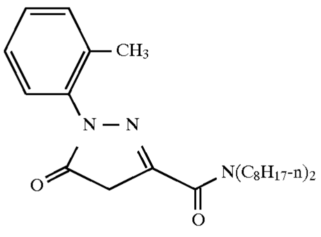
-continued
B-21
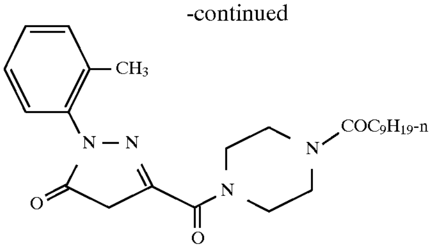
B-29
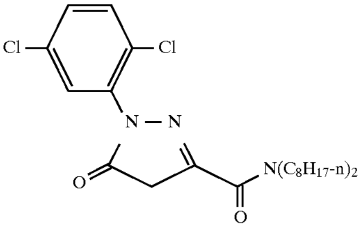
B-44
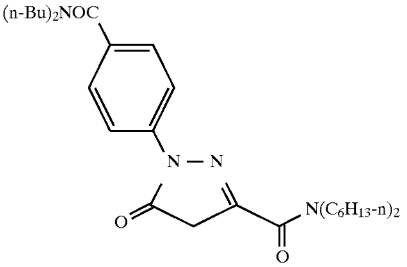
B-46
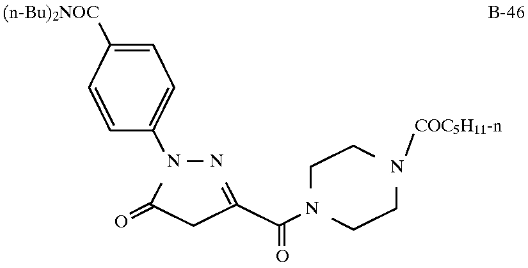
B-50
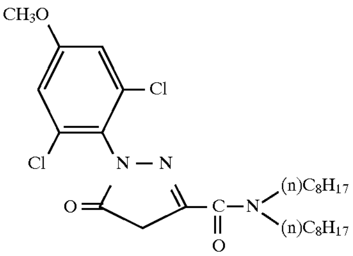
B-56
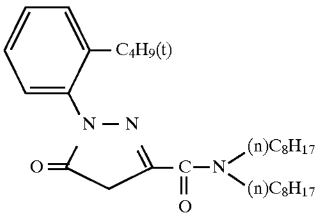
6. The heat-sensitive recording material according to any one of claims 1 through 3, wherein the diazo compound is contained in an amount of 0.02–3 g/$m^2$.
7. The heat-sensitive recording material according to claim 6, which contains a coupler in an amount of 0.1–30 parts by weight with respect to 1 part by weight of the diazo compound.

8. The heat-sensitive recording material according to any one of claims 1 through 3, which further contains a basic substance.

9. The heat-sensitive recording material according to any one of claims 1 through 3, which comprises a plurality of heat-sensitive recording layers, at least one layer of which contains at least one pyrazolone compound of formula (1).

10. The heat-sensitive recording material according to claim 4, wherein the pyrazolone compound is represented by any one of the following structural formulas (B-1) through (B-5), (B-11), (B-19), (B-21), (B-29), (B-44), (B-46), (B-50) or (B-56):

B-1

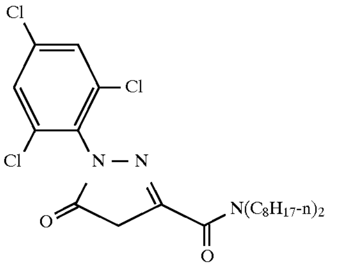

B-2

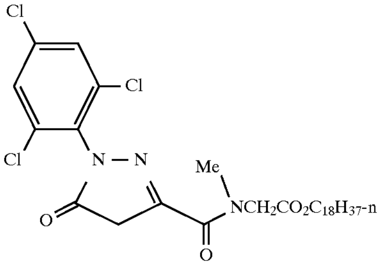

B-3

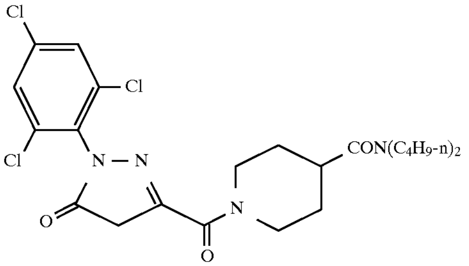

B-4

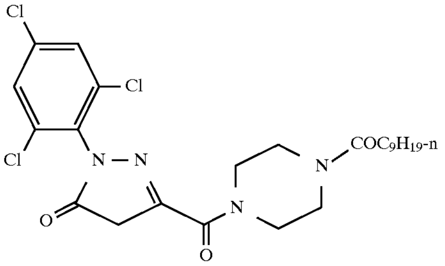

B-5

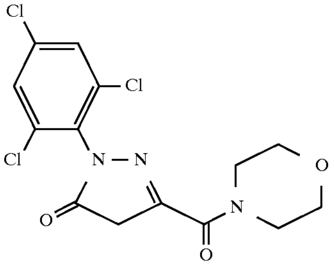

-continued

B-11

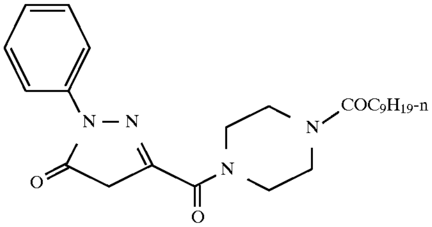

B-19

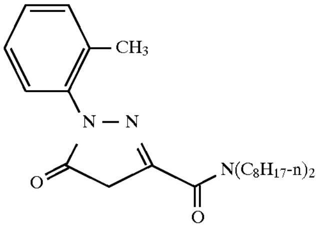

B-21

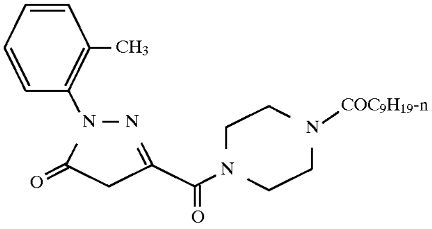

B-29

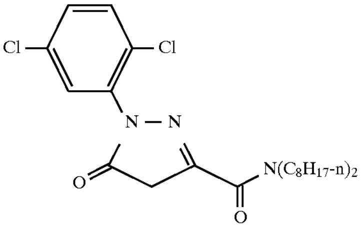

B-44

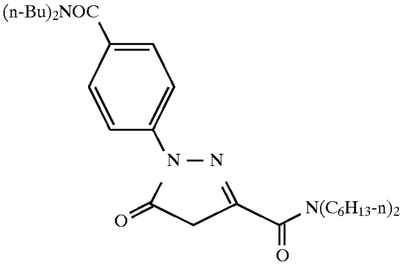

B-46

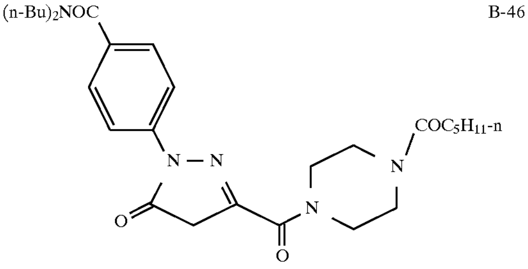

-continued

B-50

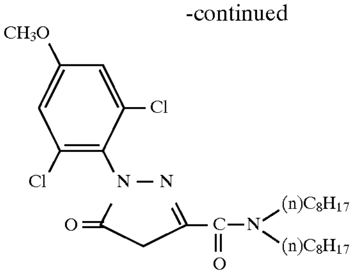

B-56

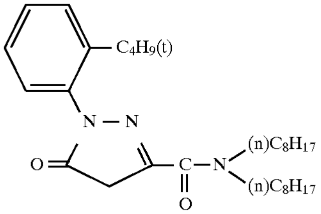

11. The heat-sensitive recording material according to claim 4, wherein the diazo compound is contained in an amount of 0.02–3 g/m$^2$.

12. The heat-sensitive recording material according to claim 5, wherein the diazo compound is contained in an amount of 0.02–3 g/m$^2$.

13. The heat-sensitive recording material according to claim 4, which further contains a basic substance.

14. The heat-sensitive recording material according to claim 5, which further contains a basic substance.

15. The heat-sensitive recording material according to claim 6, which further contains a basic substance.

16. The heat-sensitive recording material according to claim 7, which further contains a basic substance.

17. The heat-sensitive recording material according to claim 4, which comprises a plurality of heat-sensitive recording layers, at least one layer of which contains at least one pyrazolone compound of formula (I).

18. The heat-sensitive recording material according to claim 5, which comprises a plurality of heat-sensitive recording layers, at least one layer of which contains at least one pyrazolone compound of formula (I).

19. The heat-sensitive recording material according to claim 6, which comprises a plurality of heat-sensitive recording layers, at least one layer of which contains at least one pyrazolone compound of formula (I).

20. The heat-sensitive recording material according to claim 7, which comprises a plurality of heat-sensitive recording layers, at least one layer of which contains at least one pyrazolone compound of formula (I).

21. The heat-sensitive recording material according to claim 8, which comprises a plurality of heat-sensitive recording layers, at least one layer of which contains at least one pyrazolone compound of formula (I).

* * * * *

UNITED STATES PATENT AND TRADEMARK OFFICE

CERTIFICATE OF CORRECTION

PATENT NO. : 5,866,293
DATED : February 2,1999
INVENTOR(S) : Nomura et al.

It is certified that error appears in the above-identified patent and that said Letters Patent is hereby corrected as shown below:

On the title page item 56, under references cited line 7, "4,460,048" should read --4,760,048--.

Signed and Sealed this

First Day of June, 1999

Attest:

Q. TODD DICKINSON

Attesting Officer

*Acting Commissioner of Patents and Trademarks*